US007638780B2

(12) United States Patent
Kilburn et al.

(10) Patent No.: US 7,638,780 B2
(45) Date of Patent: Dec. 29, 2009

(54) UV CURE EQUIPMENT WITH COMBINED LIGHT PATH

(75) Inventors: John I. Kilburn, Hilton, NY (US); George T. McCollough, Penfield, NY (US); Rusty J. Coleman, Hilton, NY (US); Craig A. Caprio, Rochester, NY (US); James R. Kircher, Mendon, NY (US); Daniel A. Slater, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 804 days.

(21) Appl. No.: 11/169,368

(22) Filed: Jun. 28, 2005

(65) Prior Publication Data

US 2006/0292311 A1 Dec. 28, 2006

(51) Int. Cl.
*H01J 37/00* (2006.01)

(52) U.S. Cl. ............................ 250/492.1; 250/455.11; 250/504 R; 362/227; 362/243; 362/293; 118/620; 118/641; 118/642

(58) Field of Classification Search ............ 250/453.11, 250/454.11, 455.11, 492.1, 504 R; 362/227, 362/243, 293; 118/620, 641, 642
See application file for complete search history.

(56) References Cited

U.S. PATENT DOCUMENTS 3,600,060 A 8/1971 Churchill et al.
3,816,786 A 6/1974 Churchill et al.
4,070,499 A 1/1978 Ramier et al.
4,208,587 A * 6/1980 Eastlund et al. .......... 250/492.1
4,435,047 A 3/1984 Fergason
5,135,686 A 8/1992 Masuhara et al.
5,216,820 A 6/1993 Green et al.
5,251,048 A 10/1993 Doane et al.
5,700,981 A 12/1997 Tuttle et al.
6,290,881 B1 9/2001 Krohn
6,341,876 B1 * 1/2002 Moss et al. ................ 362/268
6,394,870 B1 5/2002 Petruchik et al.
6,454,405 B1 9/2002 Stowe
6,566,660 B1 5/2003 Stowe (Continued)

FOREIGN PATENT DOCUMENTS

EP 798038 A2 * 10/1997

(Continued)

OTHER PUBLICATIONS

R.W. Stowe, *The Process Window of UV-Cured Inkjet Printing*, SGIA Journal, Second Quarter 2004, pp. 3-6.

(Continued)

*Primary Examiner*—David A Vanore
*Assistant Examiner*—Michael Maskell
(74) *Attorney, Agent, or Firm*—J. Lanny Tucker

(57) ABSTRACT

The present invention relates to a curing assembly comprising at least two light sources combined into one light path, wherein the light sources are capable of curing a material exposed to the combined light path. The invention also relates to a method of curing a material or material in contact with a heat sensitive material comprising providing a curable material or a material associated with a heat sensitive material and exposing curable material to a combined light path from the curing assembly.

40 Claims, 4 Drawing Sheets

U.S. PATENT DOCUMENTS

| | | | | |
|---|---|---|---|---|
| 6,582,890 | B2 | 6/2003 | Detinger et al. | |
| 6,599,585 | B2 * | 7/2003 | Blacker et al. | 427/508 |
| 6,621,087 | B1 * | 9/2003 | Bisges et al. | 250/492.1 |
| 6,624,872 | B2 | 9/2003 | Anderson et al. | |
| 6,649,921 | B1 | 11/2003 | Cekic et al. | |
| 6,712,596 | B1 | 3/2004 | Buazza et al. | |
| 6,740,892 | B2 | 5/2004 | Wood | |
| 6,761,127 | B2 | 7/2004 | Field et al. | |
| 6,797,971 | B2 | 9/2004 | Cekic et al. | |
| 6,808,757 | B1 | 10/2004 | Lambert et al. | |
| 7,071,476 | B2 * | 7/2006 | Rothweiler et al. | 250/492.2 |
| 7,273,369 | B2 * | 9/2007 | Rosenblood et al. | 433/29 |
| 2002/0106173 | A1 | 8/2002 | Stupak et al. | |
| 2002/0182544 | A1 * | 12/2002 | Chan-Park et al. | 430/311 |
| 2003/0039711 | A1 * | 2/2003 | Blacker et al. | 425/174.4 |
| 2003/0064207 | A1 * | 4/2003 | Sigel et al. | 428/195 |
| 2003/0147258 | A1 * | 8/2003 | Fischer et al. | 362/573 |
| 2003/0175412 | A1 * | 9/2003 | Bar et al. | 427/58 |
| 2004/0071978 | A1 | 4/2004 | Hallenbeck et al. | |
| 2005/0236099 | A1 * | 10/2005 | Roller | 156/272.8 |
| 2006/0266955 | A1 * | 11/2006 | Arvin et al. | 250/492.1 |
| 2008/0067527 | A1 * | 3/2008 | Daniels et al. | 257/88 |
| 2008/0285276 | A1 * | 11/2008 | Okamitsu et al. | 362/243 |

FOREIGN PATENT DOCUMENTS

| | | | |
|---|---|---|---|
| EP | 1 293 740 | A2 | 3/2003 |
| EP | 1293740 | A2 * | 3/2003 |
| GB | 1 565 654 | A | 4/1980 |

OTHER PUBLICATIONS

Commercially available UV curing equipment, consisting of a model LC-6B conveyor assembly and two F300S UV curing lamp assemblies.

Pending U.S. Appl. No. 10/847,188, Stephenson et al.; *Reflectance-Matching Layer For Cholesteric Display Having Dye Layer And Reflective Conductors*, (D-86925/CPK).

* cited by examiner

UV CURE EQUIPMENT WITH COMBINED LIGHT PATH

FIELD OF THE INVENTION

The present invention relates to roll-to-roll processing of ultraviolet (UV) curable materials in flexible displays. In particular, the invention can be utilized in manufacturing polymer dispersed chiral nematic liquid crystal displays on flexible or heat sensitive substrates. The present invention also relates to the equipment to cure UV initiated materials, especially polymers, used in the roll-to-roll manufacture of flexible displays. In particular, the invention can be used for curing ultraviolet (UV) sensitive inks used in the fabrication of liquid crystal displays on flexible or heat sensitive substrates.

BACKGROUND OF THE INVENTION

Currently, information is displayed using assembled sheets of paper carrying permanent inks or displayed on electronically modulated surfaces such as cathode ray displays or liquid crystal displays. Printed information displayed in these manners cannot be changed. Devices that allow for the modification of information, such as electrically updated displays, are often heavy and expensive. Information may also be applied to sheet materials via magnetically written areas, for example, to carry ticketing or financial information. Such magnetically written data, however, is not visible.

Media systems exist that maintain electronically changeable data without power. Such system can be electrophoretic (Eink), Gyricon, or polymer dispersed cholesteric materials. An example of such electronically updateable displays can be found in U.S. Pat. No. 3,600,060, which shows a device having a coated, then dried emulsion of cholesteric liquid crystals in aqueous gelatin to form a field-responsive, bistable display. U.S. Pat. No. 3,816,786 also discloses a layer of encapsulated cholesteric liquid crystal responsive to an electric field. The electrodes in the patent can be transparent or non-transparent and formed of various metals or graphite. It is disclosed that one electrode must be light absorbing, and it is suggested that the light absorbing electrode be prepared from paints containing conductive material such as carbon.

Fabrication of flexible, electronically written display sheets is disclosed in U.S. Pat. No. 4,435,047. A substrate carries a first conductive electrode, one or more layers of encapsulated liquid crystals, and a second electrode of electrically conductive ink. The conductive inks form a background for absorbing light, so that the information-bearing display areas appear dark in contrast to background non-display areas. Electrical potential applied to opposing conductive areas operates on the liquid crystal material to expose display areas. Because the liquid crystal material is nematic liquid crystal, the display ceases to present an image when de-energized, that is, in the absence of a field. A first flexible substrate is patterned which is coated. A second pre-patterned substrate is bonded over the coating.

U.S. Pat. No. 5,251,048 discloses a light modulating cell having a polymer dispersed chiral nematic liquid crystal. The chiral nematic liquid crystal has the property of being electrically driven between a planar state, reflecting a specific visible wavelength of light, and a focal conic state, transmitting forward scattering light. Chiral nematic liquid crystals, also known as cholesteric liquid crystals, potentially in some circumstances have the capacity of maintaining one of multiple given states in the absence of an electric field. Black paint can be applied to the outer surface of a rear substrate to provide a light absorbing layer forming a non-changing background outside of a changeable display area defined by the intersection of segment lines and scanning lines. A first glass substrate is patterned. A second patterned glass substrate is fixable spaced from the first substrate. The cavity is filled with liquid crystal.

U.S. Pat. No. 6,394,870 discloses directly depositing opaque conductive ink in an image wise pattern by screen-printing. A conductor is printed directly over a polymer dispersed cholesteric material. Displays having such a configuration require a light absorbing backing. The invention creates the light absorber by printing second conductors formed by screen printable carbon in a resin matrix. Carbon absorbs visible light, but also absorbs ultraviolet radiation that can be used to cure ultraviolet responsive conductive formulations. If an ultraviolet cured silver ink were used, the reflection of the silver would create negligible contrast between the reflective planar and the transmissive focal conic states. The drying process for opaque conductive inks requires many minutes to cure the ink.

A photo-curable silver composition from Allied Photo Chemical is disclosed in U.S. Pat. No. 6,290,881, incorporated herein by reference. The composition is comprised of an ultraviolet light curable organic mixture, a photoinitiator, a silver powder, and a silver flake composition. The silver flake composition comprises at least 20% of the weight of the silver powder. The disclosed compositions may be used to produce silver-containing coatings on a variety of different substrates. However, this material is not disclosed for use in display devices, nor does it disclose methods to photo-cure the ink in display devices or on heat sensitive substrates. It would be useful for flexible, and or heat sensitive displays to be fabricated using simple, low cost processes. Such processes could include inexpensive, high speed methods for forming second conductors, such as in roll-to-roll processing equipment.

U.S. Ser. No. 10/847,188 discloses a dye that was coated over the polymer dispersed cholesteric liquid crystal and dried to form a complementary light absorbing layer. Second conductors were printed over the complementary light absorbing layer using a photosensitive silver filled polymer thick film ink, such as UVAG® 0010 resinous material from Allied Photochemical of Kimball, Mich. After printing the polymer thick film (PTF) ink on a panel of the polymer dispersed cholesteric liquid crystal and dye on a flexible support, the ink was exposed to ultraviolet radiation greater than 0.20 Joules/$cm^2$ to form a durable and conductive surface. The heat sensitive liquid crystal would thermally transition at these cure energies unless there was a mechanism for eliminating or removing the infrared (IR) component of the spectrum of light emitted that is absorbed by the target UV curable material. The exposed ink reached its specified conductivity after approximately 24 hours after exposure to the UV light source. However, until the specified conductivity was reached, some of the ink material would transfer to the backside of panels stacked or wrapped over the cured ink surface. To facilitate a roll-to-roll manufacturing process, it would be desirable to be able to cure the ink in such a fashion as to avoid thermal transitioning of the liquid crystal and eliminate any propensity to transfer UV cured ink to the backside of the next lap while wound in a roll. Further, it is desirable to more thoroughly cure the UV ink for increased conductivity, hardness and adhesion to the substrate.

A curing unit and method of curing ink is disclosed in U.S. Pat. No. 5,216,820A. The invention relates generally to a curing apparatus for use in screen process printing, and more particularly to an apparatus for curing photo-initiated polymer-based inks applied to flat and three dimensional articles.

The summary of the invention relates to a dual chambered cover assembly in which is disposed a reflector assembly containing a curing lamp and a means for exhausting air from the chambers of the cover. The invention further provides for heat reduction of the UV cure process by utilizing a cover assembly that consists of inner and outer covers that create an outer cooling chamber there between, and an inner cooling chamber between the inner cooling chamber and reflector assembly. The invention also includes a reflector assembly that is disposed within a cover that has at least one opening in its outer surface and defines an outer chamber. The unit further includes means for exhausting heated air from the curing chamber, and a means for drawing air though at least one opening provided in the cover into the outer chamber and exhausting the air from the outer chamber. The ends of the cover assembly form ducts, which communicate with the means for exhausting air from the chambers of the cover. The exhaust means draws external cooling air into the outer cooling chamber through openings in the outer cover and exhausts the air to cool the unit. However, this patent does not disclose use for display devices, such as a flexible display containing material that is heat sensitive. Further, there is no mechanism for eliminating or removing the IR component of the spectrum of light emitted that is absorbed by the target UV curable material. This IR component must be minimized to avoid thermal transitioning of heat sensitive substrates, such as cholesteric liquid crystal.

A paper from the SGIA journal from the second quarter 2004, titled “The process window of UV-cured inkjet printing”, suggests the significance of different wavelengths of UV light for depth and surface polymerization of UV sensitive inks or coatings. The paper suggests that most basic mercury bulbs containing additives emit energy in both long and shortwave UV, which is sufficient to provide both a depth and surface cure where there is an absence of particles or the deposited material to be cured is relatively thin. Depth of cure (long wave) is critical for proper ink adhesion to the substrate, and surface cure (short wave) is critical for no blocking of stacked or wound substrates. Experiments with single bulb UV cure configurations, for curing a UV sensitive silver bearing ink such as Allied Photochemical UVAG 0010©, have shown that a single bulb configuration does not produce an adequate cure that enables a roll-to-roll manufacturing process. To cure the ink in a roll-to-roll process, it would be advantageous to achieve a full cure where the ink on the substrate is able to be wound in a roll a short time after UV exposure without adhesive failure or blocking concerns.

When illuminating UV curable ink on opaque surfaces, such as on a PDLC coating containing a light absorbing layer between the PDLC and photo-curable ink, the ink does not fully cure to the extent that it can be wound up in a roll-to-roll manufacturing process, causing some ink transfer to the backside of sequentially wrapped layers. The physical properties of UV curable materials are affected by the radiation source used to cure them. Physical characteristics such as thickness of the curable material and presence of silver particles and flake, diffusivity and absorptivity require balancing of the wavelength parameters of the radiation source, as short wavelengths are known to work on the surface, while longer wavelengths penetrate more deeply into the material, as discussed in ‘The Process Window of US-Cured Inkjet Printing’, R. W. Stowe, SGIA Journal, Second Quarter 2004, pgs. 3-6. Insufficient exposure of the curable material results in insufficient cure, producing low resistivity, in the case of conductive materials, and blocking, that is, transfer of the curable material between rolls when the rolls are wound after processing.

Commercially available UV curing equipment, consisting of a model LC-6B conveyor assembly and two F300S UV curing lamp assemblies is shown in FIG. 5, enable a rapid cure of the silver bearing photo initiator ink in a panelized process, but is not conducive to a roll-to-roll process. One use for this tool allows for the user to expose substrates to two different UV spectrums, which are generated from two different type (doped) UV lamps. The advantage of using different spectrums allows for the user to achieve depth and surface activation of the photo initiators in the ink by utilizing long and short UV wavelengths. This process is familiar to those skilled in the art of light curing technologies. One disadvantage of this type system is that it also creates high levels of heat in the form of IR waves and hot air from the cooling of the lamps, which can be detrimental to heat sensitive substrates. Exposing an IR spectra onto a PDLC surface can cause thermal transition of the PDLC layer, and can also cause thermal-induced damage to the flexible substrate as well. In addition, the Fusion lamps are positioned at a distance from each other and illuminate different areas of the curable material, which results in non-uniform cure of material. In the case of small articles, the system is unable to expose the small areas to exposure by both light sources in a single pass, resulting in increased manufacturing complexity. Exposure to two different UV lamp spectra would require back and forth movement for curing closely adjacent panels. It would be useful to combine two different UV lamp spectra into one path to better facilitate roll-to-roll processing of the displays, especially if the roll-to-roll operation is based on intermittent motion resulting in the substrate pausing in a way that part of the printed area is exposed to both lamps, with the substrate under the gap between the two light sources exposed to only one light source. This situation will result in significant and possibly unacceptable curing variability. The most significant factor is that even a small time delay of the order of less than a second between the exposures results in a less rapid and thorough cure than the simultaneous exposure to the different spectra of two different lamps.

An illumination system for combining light from two separate light sources is disclosed in U.S. Pat. No. 6,341,876B1. The invention relates to illumination systems for producing a beam of light for illuminating a spatial light modulator, the spatial light modulator producing a spatially modulated beam of light, which may be projected on to a display screen. However, this invention does not disclose use in a UV curing chamber for curing photosensitive inks, nor does it disclose how the IR spectrum could be minimized to avoid thermal transition of a heat sensitive substrate.

U.S. Pat. No. 6,621,087 discloses a device for curing a UV coating on a substrate, in particular on heat-sensitive materials, with at least one light source that is located above the substrate. The light can be directed to the UV coating via a reflector system, including at least one barrier, which prevents the direct beam path of the light source from striking the substrate. The UV radiation emitted by the light source is reflected by a UV reflection coating of the barrier through the light source to the reflectors located behind the light source, and the barrier includes at least one heat absorbing body that absorbs the heat radiation emitted by the light source. In one embodiment of the invention, it is possible to focus the UV radiation on the substrate. This invention enables an effective separation of the UV radiation from the IR radiation in order to reduce the heat load of the substrate and at the same time to achieve a high UV intensity through short beam paths necessary for curing. However, U.S. Pat. No. 6,621,087 does not involve combination of multiple light sources into a single path to achieve improved cure and ease/improvements in roll-to-roll or discrete parts manufacturing.

PROBLEM TO BE SOLVED

There remains a need for a system that produces a more rapid, uniform and thorough cure of a UV-curable material, which may be used in a roll-to-roll or continuous type manufacturing operation, especially when the curable material is in contact with a thermally sensitive material.

SUMMARY OF THE INVENTION

The present invention relates to a curing assembly comprising at least two light sources, wherein each of the at least two light sources has a spectrum, wherein the spectrum of each of the at least two light sources is combined into one light path, and wherein the at least two light sources are capable of curing a material exposed to the one combined light path. And a method or process for curing a material comprising providing a curable material and exposing the curable material to a combined light path from a curing assembly, wherein the curing assembly comprises at least two light sources, wherein each of the at least two light sources has a spectrum, wherein the spectrum of each of the at least two light sources is combined into one light path, and wherein the at least two light sources are capable of curing a material exposed to the one combined light path.

ADVANTAGEOUS EFFECT OF THE INVENTION

The present invention includes several advantages, not all of which are incorporated in a single embodiment. The present invention provides rapid, uniform, and thorough curing of UV or radiation-curable materials through the use of multiple light source spectra, which have been combined into a single path, such that the UV curable substrate is exposed to the radiation spectra from both sources simultaneously. The exposure of shorter wavelength spectra, which is more effective in stimulating the UV polymerization initiator at the surface, and exposure of the longer wavelength radiation spectra, which is more effective in stimulating the UV polymerization initiator in the depth of the UV curable material in, at the same time, results in more rapid and complete polymerization in the entire UV curable material than would occur from separate exposure to multiple light sources with even a small offset in time.

This invention is useful as an enhancement for those roll-to-roll operations, as opposed to prior art processes, which require forward/backward movement of oriented/adjacent panels on a web. Dual wavelength ultraviolet exposure of silver bearing ink permits for high speed fabrication and curing of UV curable deposited conductors, by incorporating long and short wave UV spectra. The present invention, by providing for rapid and more thorough cure of the material prior to winding, eliminates or greatly reduces blocking, that is transfer of uncured material to the surface it contacts when in wound roll form and also provides for a more conductive cured material.

The present invention also provides for heat management, an important issue in the case of thermally sensitive materials, which may support or be in contact with the curable material or be the curable material itself.

DETAILED DESCRIPTION OF THE INVENTION

Figure 1:
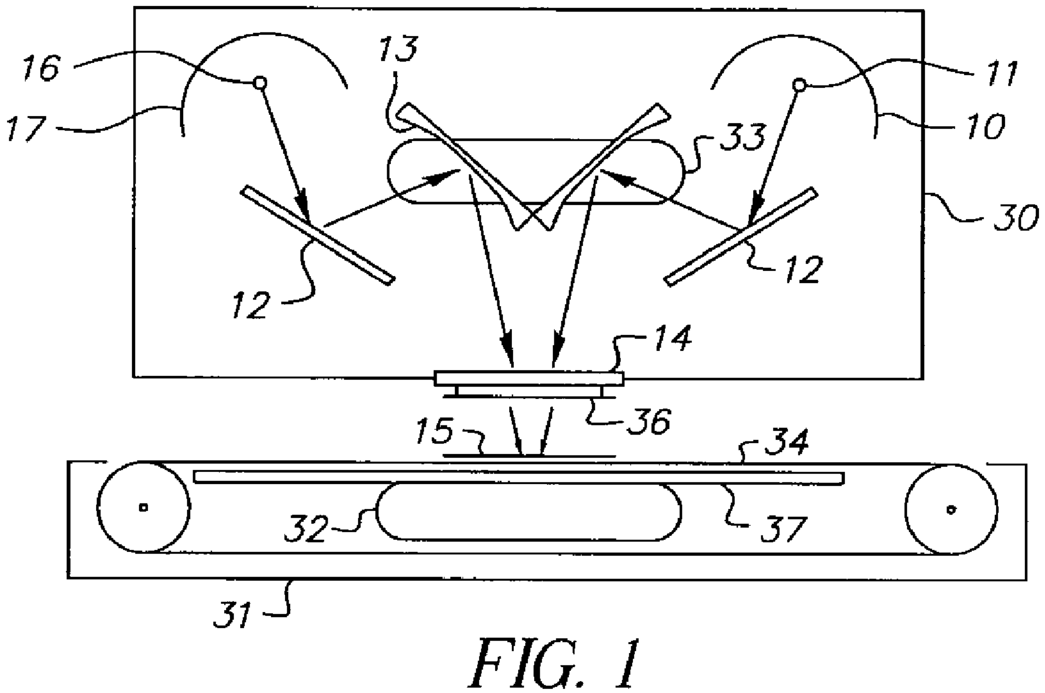
FIG. 1 is a representation of a system to combine two light paths into a single path for contacting a curable material on a substrate or support, by utilizing mirrors, infrared absorbing mirrors and one or more IR or light absorbing filters in a stack in the light path.

The present invention relates to the curing of a radiation curable material through the exposure of the material to a curing assembly with at least two light sources, which are combined in such a way to produce a combined light path. The present invention also relates to an improved method for rapid and thorough curing for UV curable coatings, adhesives, sealants, printed material, jetted material, and material applied by any means. The present invention can be used for curing materials applied to continuous webs, panels or any structure that has UV curable material applied to it that can be exposed to the single beam from two or more distinct UV light sources. The invention is particularly useful where the thickness of the material to be cured, the presence of particles, flakes or droplets in the UV curable material, or heat sensitivity of the UV curable materials or substrates make rapid and thorough curing difficult to achieve with the current art.

Such a need exists with roll-to-roll processing of UV curable materials in flexible displays, where rapid curing would allow winding without transfer of the material to the backside of the subsequent wound lap. More thorough curing provides improved conductivity of conductive inks along with improved hardness and adhesion to the substrate. In particular, the invention can be utilized in manufacturing polymer dispersed chiral nematic liquid crystal displays on flexible or heat sensitive substrates. The present invention also relates to the equipment to cure UV initiated polymers used in the roll-to-roll manufacture of flexible displays. In particular, the invention can be used for curing ultraviolet (UV) sensitive inks used in the fabrication of liquid crystal displays on flexible or heat sensitive substrates.

This invention provides an apparatus and process for use in a continuous and intermittent motion or static exposure modes. This invention is particularly valuable in intermittent roll-to-roll operations where the substrate will pause during an operation, for example printing, where if the light sources were offset in distance some substrate would be exposed for a significant time by only one spectrum. This delay will result in variability within the length of the roll of cure effectiveness, which is not desirable.

The minimization of the IR spectra in the radiation that exposes the substrate by the addition of infrared reflecting or absorbing filters, and a filter that is of the same wavelength as any light absorbing layer in the UV light path, greatly reduce temperature induced into thermally sensitive layers, if present, and the substrate during the UV cure process. Further heat reduction is accomplished by isolating the light source chamber from the transport mechanism to which the substrate is held.

Any light sources may be used so long as the spectrum of the light sources are compatible with the spectral sensitivity of the photoinitiators in the curable material. A spectrum is defined as a range of wavelengths. A wavelength as used in herein refers to a particular numerical value determined by the distance between adjacent peaks, also referred to as crests, in a wave train is the wavelength. The number of such crests passing a fixed point in 1 second is known as the frequency (a crest per second=1 Hertz); a short wavelength thus implies high frequency. Of light, the unit of wavelength is the angstrom (Å), measured as $10^{-10}$ meters. Visible light is of between 4,000 and 7,500 Å. Wavelengths in this range are perceived by the eye as the different colors of the spectrum. Preferably, the light source is a UV source, which, in the present invention is intended to inherently include some IR. The light source may include spectral ranges in the visible range, the invisible range, as well as combinations thereof. In one embodiment, the light sources preferably have different spectral ranges. However, the multiple sources may also have identical or overlapping spectral ranges. Light sources may include predominantly short wavelength bulbs, for example an H-bulb from Fusion UV, Inc., predominantly long wavelength bulbs, for example, a D-bulb also from Fusion UV, Inc. In one preferred embodiment, the curing assembly of utilizes at least one short wavelength UV bulb in combination with at least one long wavelength UV bulb.

The light path refers to the beam or column of light. The combined light path may be determined by measuring the spectral output of the combined beam and determining the presence of spectra from both light sources.

The light sources may be combined to produce a single light path in a variety of ways. In one embodiment, the multiple light sources are positioned so that the beams produced by each source illuminate the same area on a material to be cured. In one embodiment, the light sources may be directed to a combining mirror or mirrors, which combine the multiple light paths into one. In another embodiment, the light sources may be directed to a refractive element, such as a lens or lenses, which combine or focus the multiple light paths into one combined light path. Combinations of refractive elements and mirrors may also be used. In another embodiment, reflective surfaces are used to funnel light to the UV curable material to increase the exposure. In other embodiments, shutters, a rotary valve, an aperture or a slide gate may be used to expose the target or to block the UV light to the target. By combining both light sources into a single path, the ability to expose or not expose the target UV curable material is made simple for anyone practiced in the art.

At least one reflector may be used to redirect the spectra of the radiation sources. The preferred reflectors are mirrors, lenses and combinations thereof. In a typical embodiment, at least one mirror is associated with each light source. By "associated with" is meant that the mirror is at least close enough to affect the light source. The mirror may be any mirror capable of redirecting the light path. The mirror may have a spherical or parabola surface to improve efficiency of the amount of transmitted light. The mirror may be a combining mirror, which redirects the light source or sources into a single path. A fold mirror or mirrors or a funneling mirror or mirrors may also be present, which redirect the light source(s) output to the combining mirror. The mirror may also have a means to independently adjust the angle of light incidence from the fold mirrors to the substrate.

The mirrors may be treated in a variety of ways. In one embodiment, the mirror is treated with a dichroic surface coating. The dichroic coating may be capable of absorbing or reflecting portions of the light source spectra, but preferably transmits most of the UV spectra. In a preferred embodiment, the reflector is a dichroic elliptical reflector. In one preferred embodiment, the dichroic coating either absorbs or reflects regions of the IR spectra. These dichroic coated reflectors may be referred to as hot mirrors or cold mirrors. A hot mirror absorbs portions of the spectra. A cold mirror reflects portions of the spectra.

The refractive element may be any element capable of redirecting, here, focusing, the output from the light sources into one light path and is intended to improve or maximize the amount of light reaching the surface to be cured. The refractive element may be used to focus the light, combine the light, or a combination thereof. The preferred refractive element is a lens, although any element capable of collimating light may be used. In one embodiment, the lens is a fused silica lens.

One or more filters may be used, alone or in combination with the reflectors, refractive elements or combinations thereof. The combined light may be transmitted through a light filter, infrared filter, quartz plate, or any possible combination of filters, to the substrate. In a preferred embodiment, the filter is a visible light filter. The filters selectively reduce the portion of the spectra that reach the surface to be cured. The filters may also serve to reduce the heat generated by the light source by isolating the light source from the curable material, while allowing the combined light path to be transmitted to the curable material on the substrate. In the case of thermally sensitive materials, the filter may be matched to the absorptivity of the thermally sensitive material, to selectively remove the wavelength or range of wavelengths to which the thermally sensitive material is sensitive. For example, the filter may be a blue filter.

The intensity of the spectral output may be adjusted. In the case of refractive elements, the intensity may be modified by adjusting focal length, wherein focal length is the distance from the curable material to the light source. For example, the support may be defocused by a total of 3 inches. Another method of adjusting intensity may be by changing the angle of incidence. Yet another method may be to adjust the lamp output intensity. A shutter or aperture may also be used to control spectral output.

A thermal reduction system is preferably included in the curing assembly. The thermal reduction system is capable of removing thermal radiation (heat) from the assembly to reduce the impact of radiative curing on any heat sensitive materials. Heat reduction may be accomplished through the use of infrared mirrors or absorbers, filters, for example, a visible spectra filter, in the light path, an air flow or air exhaust system, heat sinks, heat exchangers, or by isolating the lamp chamber from the substrate or any combination thereof. Isolation may be occur through the use of shutters, apertures or light filters, typically located between the light sources and the curable material. In one preferred embodiment, the chamber design of the curing assembly limits the amount of heat from the lamps to the substrate by redirecting the lamp supply cooling air to an upper chamber exhaust port. An upper/lower chamber isolation assembly may serve to isolate the upper and lower chamber, as well as reduce the amount of heat sensed by the substrate on the transport belt. In one embodiment, heat reduction is accomplished via infrared mirrors/absorbers and a visible spectra filter in the light path, as well as by pulling cooling air into the assembly and removing the heated air and further isolating the lamps from the substrate. The substrate may be further cooled by a cooling mechanism in the transport belt.

The curable material may comprise any material that is UV curable and may be applied by coating, printing, spraying, jetting, flooding, transfer from a donor, or any method that results in UV curable material or materials deposited on a surface. This may include materials that require some chemical mechanism, such as crosslinking, to cure as well as evaporation of a carrier solvent. In one embodiment, the curable material may comprise a polymeric material. The curable materials may be in the form of, but are not limited to, imageable layers, light modulating layers, printable conductive inks, conductive layers, color contrast layers, dielectric layers, sealants, adhesives, paints, protective coatings, and barrier layers. The curable material may be directly applied to the substrate or it may be applied with a carrier material that may be later removed to facilitate the curing process, such as a solvent.

The curable layer may comprise a dielectric material. A dielectric layer, for purposes of the present invention, is a layer that is not conductive or blocks the flow of electricity. This dielectric material may include a UV curable, thermoplastic, screen printable material, such as Electrodag 25208 dielectric coating from Acheson Corporation. The dielectric material forms a dielectric layer. This layer may include openings to define image areas, which are coincident with the openings. Since the image is viewed through a transparent substrate, the indicia are mirror-imaged. The dielectric material may form an adhesive layer to subsequently bond a second electrode to the light modulating layer.

When utilizing inks containing photosensitive oligomers, the curing process may occur by any means known to those of skill in the art of curing coatings, such as through application of light, heat, or some other source of energy. Light activation of the curing process may occur through exposure to ultraviolet, visible, infrared light, or combinations thereof, which then initiates a chemical reaction to cure the materials, such as through crosslinking polymerizations.

The typical curing process for a roll-to-roll operation takes place in several steps: (a) initiation, (b) machine conveyance curing, and (c) wound roll curing. There are two primary methods to cure the coatings: actinic and thermal. In actinic curing, polymerization of prepolymeric inks with less than 10% volatiles is initiated by the application of electromagnetic energy. UV wavelengths at less than 386 nanometers are used for this process. Dosage limits are 100 to 700 mJ/cm2 with 200 to 500 mJ/cm2 preferred. Temperature and air flow are standard for one skilled in the art. With the prior art, curing was not rapid or complete enough after UV exposure to allow for winding without additional time to fully complete the curing process. In the wound roll, the web requires time without lap-to-lap contact to fully cure so that no material is transferred to the backside of the subsequent lap (blocking).

In the present invention, curable materials are typically applied to a support, also referred to herein as a substrate. The curable materials may be applied to the support by any method known by those of skill in the art to form a layer. Some exemplary methods may include screen printing, hopper coating, gravure printing, lithographic and photolithographic printing, ink jet printing, spraying, and vapor depositing.

The preferred support is a plastic support, most preferably flexible. The flexible plastic substrate may be any flexible self-supporting plastic film that supports the thin conductive metallic film. "Plastic" means a high polymer, usually made from polymeric synthetic resins, which may be combined with other ingredients, such as curatives, fillers, reinforcing agents, colorants, and plasticizers. Plastic includes thermoplastic materials and thermosetting materials. Although the preferred support is a plastic support, other types of supports may be used including but not limited to glass, metal, wood and cloth.

Typically, the flexible plastic substrate is polyethylene terephthalate (PET), polyethylene naphthalate (PEN), polyethersulfone (PES), polycarbonate (PC), polysulfone, a phenolic resin, an epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl (x-methacrylates), an aliphatic or cyclic polyolefin, polyarylate (PAR), polyetherimide (PEI), polyethersulphone (PES), polyimide (PI), Teflon poly(perfluoro-alboxy) fluoropolymer (PFA), poly(ether ether ketone) (PEEK), poly(ether ketone) (PEK), poly(ethylene tetrafluoroethylene)fluoropolymer (PETFE), and poly (methyl methacrylate) and various acrylate/methacrylate copolymers (PMMA). Aliphatic polyolefins may include high density polyethylene (HDPE), low density polyethylene (LDPE), and polypropylene, including oriented polypropylene (OPP). Cyclic polyolefins may include poly(bis(cyclopentadiene)). A preferred flexible plastic substrate is a cyclic polyolefin or a polyester. Various cyclic polyolefins are suitable for the flexible plastic substrate. Examples include Arton® made by Japan Synthetic Rubber Co., Tokyo, Japan; Zeanor T made by Zeon Chemicals L. P., Tokyo Japan; and Topas® made by Celanese A. G., Kronberg Germany. Arton is a poly(bis(cyclopentadiene)) condensate that is a film of a polymer. Alternatively, the flexible plastic substrate may be a polyester. A preferred polyester is an aromatic polyester such as Arylite. Although various examples of plastic substrates are set forth above, it should be appreciated that the substrate may also be formed from other materials such as glass and quartz.

The flexible plastic substrate may be reinforced with a hard coating. Typically, the hard coating is an acrylic coating. Such a hard coating typically has a thickness of from 1 to 15 microns, preferably from 2 to 4 microns and may be provided by free radical polymerization, initiated either thermally or by ultraviolet radiation, of an appropriate polymerizable material. Depending on the substrate, different hard coatings may be used. When the substrate is polyester or Arton, a particularly preferred hard coating is the coating known as "Lintec." Lintec contains UV-cured polyester acrylate and colloidal silica. When deposited on Arton, it has a surface composition of 35 atom % C, 45 atom % 0, and 20 atom % Si, excluding hydrogen. Another particularly preferred hard coating is the acrylic coating sold under the trademark "Terrapin" by Tekra Corporation, New Berlin, Wis.

In a preferred embodiment, the curable material is associated with, particularly, in contact with, at least one thermally sensitive material. By "associated with" is meant that the curable layer is at least close enough to affect the temperature of the heat sensitive layer, when the curable material is cured. For example, the curable material may be coated on a thermally sensitive support or a bistable liquid crystal layer. The thermally sensitive material may also be the curable layer or be a component of the curable layer. There may be intervening layers between the curable material and the heat sensitive material, for example, a pigmented layer. However the intervening layers are not able to reduce thermal transfer between the curable material and the heat sensitive material to a level below a level capable of affecting the heat sensitive material.

The thermally sensitive material may preferably be an imageable material. The imageable materials may be an electrically imageable material. The electrically imageable material may be light emitting or light modulating. Light emitting materials may be inorganic or organic in nature. Particularly preferred are organic light emitting diodes (OLED) or polymeric light emitting diodes (PLED). The light modulating material may be reflective or transmissive. Light modulating materials may be electrochemical, electrophoretic, such as Gyricon particles, electrochromic, or liquid crystals. The liquid crystalline material may be twisted nematic (TN), supertwisted nematic (STN), ferroelectric, magnetic, or chiral nematic liquid crystals. Especially preferred are chiral nematic liquid crystals. The chiral nematic liquid crystals may be polymer dispersed liquid crystals (PDLC). Structures having stacked imaging layers or multiple support layers, however, are optional for providing additional advantages in some case.

A suitable material may include electrically modulated material disposed on a suitable support structure, such as on or between one or more electrodes. The term "electrically modulated material" as used herein is intended to include any suitable non-volatile material. Suitable materials for the electrically modulated material are described in U.S. patent application Ser. No. 09/393,553 and U.S. Provisional Patent Application Ser. No. 60/099,888, the contents of both applications are herein incorporated by reference.

In a preferred embodiment, the electrically imageable material can be addressed with an electric field and then retain its image after the electric field is removed, a property typically referred to as "bistable". Particularly suitable electrically imageable materials that exhibit "bistability" are electrochemical, electrophoretic, such as Gyricon particles, electrochromic, magnetic, or chiral nematic liquid crystals. Especially preferred are chiral nematic liquid crystals used in a liquid crystal display.

The electrically modulated material may also be a printable ink having an arrangement of particles or microscopic containers or microcapsules. Each microcapsule contains an electrophoretic composition of a fluid, such as a dielectric or emulsion fluid, and a suspension of colored or charged particles or colloidal material. The diameter of the microcapsules typically ranges from 30 to 300 microns. According to one practice, the particles visually contrast with the dielectric fluid. According to another example, the electrically modulated material may include rotatable balls that can rotate to expose a different colored surface area, and which can migrate between a forward viewing position and/or a rear non-viewing position, such as gyricon. Specifically, gyricon is a material comprised of twisting rotating elements contained in liquid filled spherical cavities and embedded in an elastomer medium. The rotating elements may be made to exhibit changes in optical properties by the imposition of an external electric field. Upon application of an electric field of a given polarity, one segment of a rotating element rotates toward, and is visible by an observer of the display. Application of an electric field of opposite polarity, causes the element to rotate and expose a second, different segment to the observer. A gyricon display maintains a given configuration until an electric field is actively applied to the display assembly. Gyricon particles typically have a diameter of about 100 microns. Gyricon materials are disclosed in U.S. Pat. No. 6,147,791, U.S. Pat. No. 4,126,854 and U.S. Pat. No. 6,055,091, the contents of which are herein incorporated by reference.

According to one practice, the microcapsules may be filled with electrically charged white particles in a black or colored dye. Examples of electrically modulated material and methods of fabricating assemblies capable of controlling or effecting the orientation of the ink suitable for use with the present invention are set forth in International Patent Application Publication Number WO 98/41899, International Patent Application Publication Number WO 98/19208, International Patent Application Publication Number WO 98/03896, and International Patent Application Publication Number WO 98/41898, the contents of which are herein incorporated by reference.

The electrically modulated material may also include material disclosed in U.S. Pat. No. 6,025,896, the contents of which are incorporated herein by reference. This material comprises charged particles in a liquid dispersion medium encapsulated in a large number of microcapsules. The charged particles may have different types of color and charge polarity. For example white positively charged particles may be employed along with black negatively charged particles. The described microcapsules are disposed between a pair of electrodes, such that a desired image is formed and displayed by the material by varying the dispersion state of the charged particles. The dispersion state of the charged particles is varied through a controlled electric field applied to the electrically modulated material. According to a preferred embodiment, the particle diameters of the microcapsules are between 5 microns and 200 microns, and the particle diameters of the charged particles are between one-thousandth and one-fifth the size of the particle diameters of the microcapsules.

Further, the electrically modulated material may include a thermochromic material. A thermochromic material is capable of changing its state alternately between transparent and opaque upon the application of heat. In this manner, a thermochromic imaging material develops images through the application of heat at specific pixel locations in order to form an image. The thermochromic imaging material retains a particular image until heat is again applied to the material. Since the rewritable material is transparent, UV fluorescent printings, designs and patterns underneath can be seen through the rewritable material.

The electrically modulated material may also include surface stabilized ferrroelectric liquid crystals (SSFLC). Surface stabilized ferroelectric liquid crystals confine ferroelectric liquid crystal material between closely spaced glass plates to suppress the natural helix configuration of the crystals. The cells switch rapidly between two optically distinct, stable states simply by alternating the sign of an applied electric field.

Magnetic particles suspended in an emulsion comprise an additional imaging material suitable for use with the present invention. Application of a magnetic force alters pixels formed with the magnetic particles in order to create, update or change human and/or machine readable indicia. Those skilled in the art will recognize that a variety of bistable non-volatile imaging materials are available and may be implemented in the present invention.

The electrically modulated material may also be configured as a single color, such as black, white or clear, and may be fluorescent, iridescent, bioluminescent, incandescent, ultraviolet, infrared, or may include a wavelength specific radiation absorbing or emitting material. There may be multiple layers of electrically modulated material. Different layers or regions of the electrically modulated material display material may have different properties or colors. Moreover, the characteristics of the various layers may be different from each other. For example, one layer may be used to view or display information in the visible light range, while a second layer responds to or emits ultraviolet light. The non-visible layers may alternatively be constructed of non-electrically modulated materials that have radiation absorbing or emitting characteristics. The electrically modulated material employed in connection with the present invention preferably has the characteristic that it does not require power to maintain display of indicia.

The preferred thermally sensitive material for use with the curing device is a liquid crystal material. Liquid crystals may be nematic (N), chiral nematic (N*), or smectic, depending upon the arrangement of the molecules in the mesophase. Chiral nematic liquid crystal refers to the type of liquid crystal having finer pitch than that of twisted nematic and super-twisted nematic. Chiral nematic liquid crystals are so named because such liquid crystal formulations are commonly obtained by adding chiral agents to host nematic liquid crystals. Chiral nematic liquid crystals may be used to provide bistable and multistable reflective displays that, due to their non-volatile "memory" characteristic, do not require a continuous driving circuit to maintain a display image, thereby significantly reducing power consumption. Chiral nematic displays are bistable in the absence of a field, the two stable textures being the reflective planar texture and the weakly scattering focal conic texture. In the planar texture, the helical axes of the chiral nematic liquid crystal molecules are substantially parallel to the support upon which the liquid crystal is disposed. In the focal conic state, the helical axes of the liquid crystal molecules are generally randomly oriented. By adjusting the concentration of chiral dopants in the chiral nematic material, the pitch length of the molecules and, thus, the wavelength of radiation that they will reflect, may be adjusted. Chiral nematic materials that reflect infrared radiation have been used for purposes of scientific study. Commercial displays are most often fabricated from chiral nematic materials that reflect visible light. Some known LCD devices include chemically etched, transparent, conductive layers overlying a glass substrate as described in U.S. Pat. No. 5,667,853, incorporated herein by reference.

Modern chiral nematic liquid crystal materials usually include at least one nematic host combined with a chiral dopant. Suitable chiral nematic liquid crystal compositions preferably have a positive dielectric anisotropy and include chiral material in an amount effective to form focal conic and twisted planar textures. Chiral nematic liquid crystal materials are preferred because of their excellent reflective characteristics, bistability and gray scale memory. The chiral nematic liquid crystal is typically a mixture of nematic liquid crystal and chiral material in an amount sufficient to produce the desired-pitch length.

Chiral nematic liquid crystal materials and cells, as well as polymer stabilized chiral nematic liquid crystals and cells, are well known in the art and described in, for example, U.S. Pat. No. 5,695,682, U.S. application Ser. No. 07/969,093, Ser. No. 08/057,662, Yang et al., Appl. Phys. Lett. 60(25) pp 3102-04 (1992), Yang et al., J. Appl. Phys. 76(2) pp 1331 (1994), published International Patent Application No. PCT/US92/09367, and published International Patent Application No. PCT/US92/03504, all of which are incorporated herein by reference.

FIG. 1 is a representation of a system to combine two light paths into a single path, by utilizing fold mirrors, a combining mirror, heat reduction via infrared mirrors/absorbers with a visible spectra filter in the light path, and isolating the lamp chamber from the transport mechanism that holds the substrate. Modeling data for the system of FIG. 1 indicates a system efficiency of 22-45%. In the representation of FIG. 1, an irradiating lamp assembly combines two lamp light spectra into one light path, in accordance with the present invention. Ultraviolet and infrared light spectra is generated from lamps (11) and (16) with the light being transmitted to the fold mirrors (12), via reflectors (10) and (17) that may have a dichroic coating to absorb some infrared light energy from the lamps, but transmit most of the UV spectra. The fold mirrors, that may have cooling means and also may have a dichroic coating that absorbs some IR, transmit the two light paths to the combining mirror (13), which combine the two light paths into one. The combining mirror (13) may have a spherical or parabola surface to improve efficiency of the amount of transmitted light. The combining mirror may also have a means to independently adjust the angle of light incidence from the fold mirrors (12) to the substrate (15). The combined light is then transmitted through an optional light filter (14) mounted on a frame (36), where infrared or visible light is removed, before exposing the substrate (15). Reduction of heat generated by the lamp quartz envelopes is accomplished by pulling cooling air into the upper frame (30) and removing the heated air through the upper chamber exhaust port (33) and by isolating the upper chamber (30) from the lower chamber (31) by the light filter (14) mounted on a frame (36), while allowing the desired spectrum of light path to transmit to the substrate (15). The substrate (15) is passed through the combined light path via a moving perforated transport belt (34) sliding on a heat exchanger with holes (37), which holds the substrate to the belt by vacuum generated by the lower chamber (31) exhaust vacuum supply (32).

Figure 2:
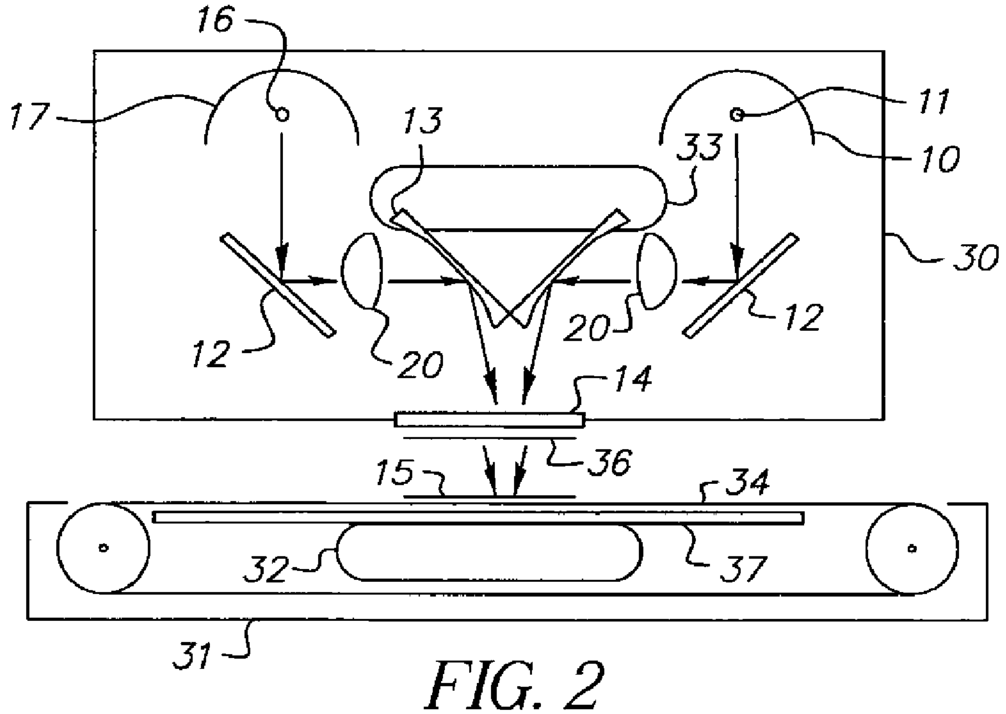
FIG. 2 is a representation of a system to combine two light paths into a single path, by utilizing mirrors, refractive elements, infrared absorbing mirrors and one or more IR or light absorbing filters in a stack in the light path.

FIG. 2 is a representation of a system to combine two light paths into a single path, by utilizing fold mirrors, refractive elements, and a combining mirror. Heat reduction is accomplished via infrared mirrors/absorbers and a visible spectra filter in the light path, as well as isolating the lamp chamber from the transport mechanism that holds the substrate. Modeling data for the system of FIG. 2 indicates a system efficiency of approximately 28%. In FIG. 2, an irradiating lamp assembly combines two lamp light spectra into one light path, in accordance with the present invention. Ultraviolet and infrared light spectra is generated from lamps (11) and (16) with the light being transmitted to the fold mirrors (12), via reflectors (10) and (17) that may have a dichroic coating to absorb some infrared light energy from the lamps, but transmit most of the UV spectra. The fold mirrors, that may have cooling means and also may have a dichroic coating that absorbs some IR, transmit the two light paths to refractive elements (20) that serve the purpose of a field lens, which then transmit the two light paths to the combining mirror (13). The combining mirror may have a spherical or parabola surface to improve efficiency of the amount of transmitted light. The combining mirror (13) may also have a means to independently adjust the angle of light incidence from the refractive elements (20) to the substrate (15). The combined light is then transmitted through an optional light filter (14) mounted on a frame (36), where infrared or visible light is removed, before exposing the substrate (15). Reduction of heat generated by the lamp quartz envelopes is accomplished by pulling cooling air into the upper frame (30) and removing the heated air through the upper chamber exhaust port (33) and by isolating the upper chamber (30) from the lower chamber (31) by the light filter (14) mounted on a frame (36), while allowing the desired spectrum of light to transmit to the substrate (15). The substrate (15) is passed through the combined light path via a perforated transport belt (34) sliding on a heat exchanger with holes (37), which holds the substrate to the belt by vacuum generated by the lower chamber (31) exhaust/vacuum supply (32). In one preferred embodiment, the improved chamber design limits the amount of heat from the lamps to the substrate by redirecting the lamp supply cooling air to a new upper chamber exhaust port. The upper/lower chamber isolation assembly serves to isolate the upper and lower chamber, as well as reduce the amount of heat sensed by the substrate on the transport belt.

Figure 3:
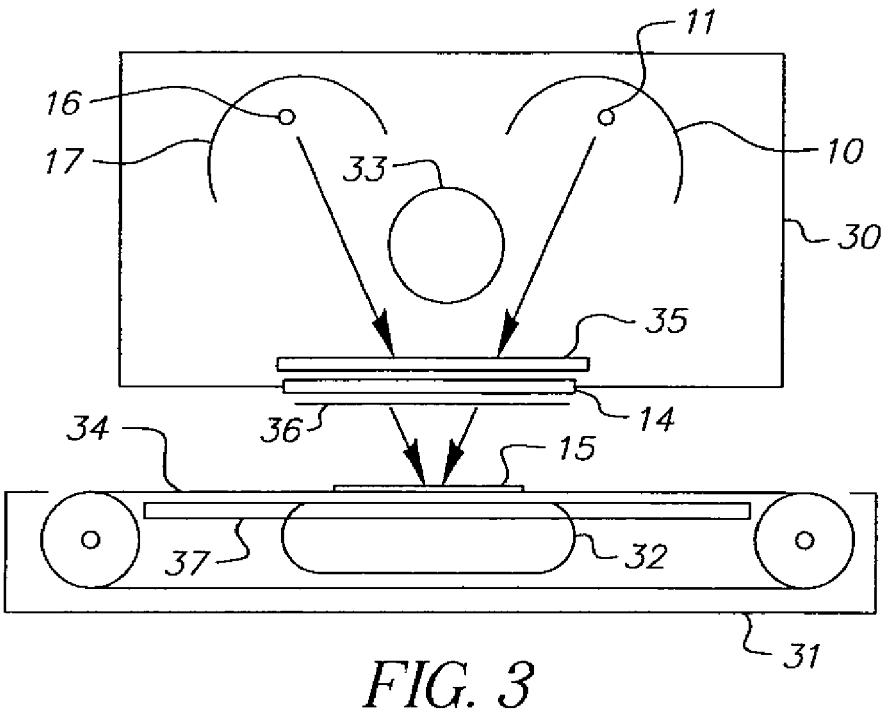
FIG. 3 is a representation of a system to combine two light paths into a single path by utilizing one or more IR or light absorbing filters in a stack and positioning/angling the lamp assemblies such that a combined lamp spectra reaches the substrate.

FIG. 3 is a representation of a system to combine two light paths into a single path by positioning/angling the lamp assemblies such that a combined lamp spectra reaches the substrate. Heat reduction is accomplished via infrared mirrors/absorbers and a visible spectra filter in the light path, as well as by pulling cooling air into the upper frame (30) and removing the heated air through the upper chamber exhaust port (33) and by isolating the lamp chamber from the transport mechanism that holds the substrate. Modeling data for the system of FIG. 3 indicates a system efficiency of approximately 24%. In FIG. 3, an irradiating lamp assembly combines two lamp light spectra into one light path, in accordance with the present invention. An ultraviolet and infrared spectrum is generated from lamps (11) and (16) with the light being transmitted through an optional light filter (14) mounted on a frame (36), where infrared or visible light is removed, before exposing the substrate (15). Reduction of heat generated by the lamp quartz envelopes is accomplished by isolating the upper chamber (30) from the lower chamber (31) by the light filter (14) mounted on a frame (36), while allowing the desired spectrum of light to transmit to the substrate (15). The substrate (15) is passed through the combined light path via a perforated transport belt (34) sliding on a heat exchanger with holes (37), which holds the substrate to the belt by vacuum generated by the lower chamber (31) exhaust/vacuum supply (32). This embodiment provides a means to isolate the upper chamber (8) from the lower chamber (9), thereby preventing the lamp quartz heated cooling air from reaching the transport belt (34). The embodiment also provides a means to reduce the lamp generated infrared heat from reaching the transport belt by incorporating an IR reflective dichroic coating on some of the quartz plate(s) (10), and also incorporating a selective visible light dichroic coating (filter) on a quartz plate (10) to further reduce heat to a substrate on the transport belt (34). Further heat reduction is accomplished by redirecting heat from the lamps to the upper chamber exhaust port (33).

Figure 4:
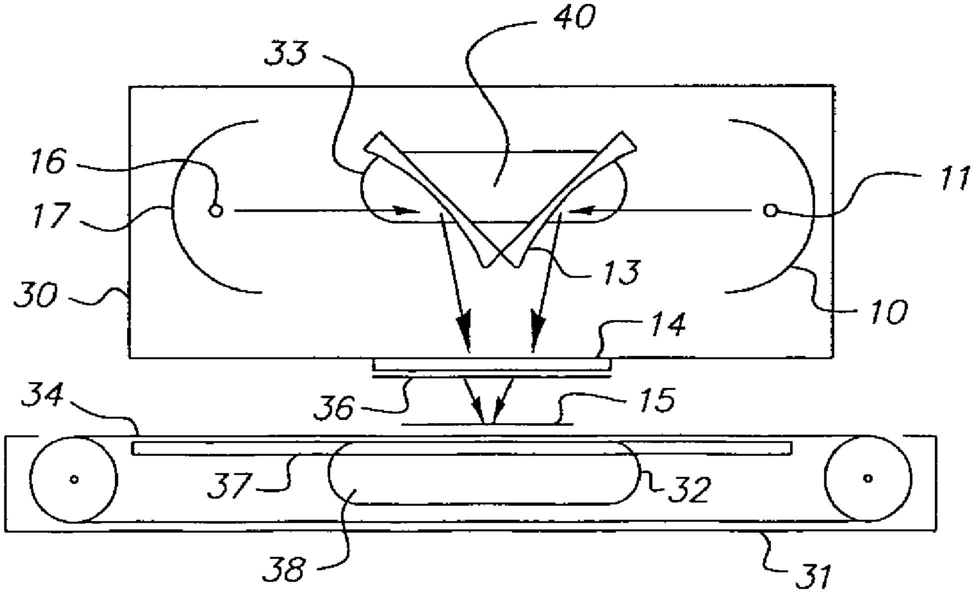
FIG. 4 is a representation of a system to combine two light paths into a single path by positioning the lamp assemblies horizontally, and directing the two light paths to an infrared absorbing mirror and through one or more IR or light absorbing filters in a stack.

FIG. 4 is a representation of a system to combine two light paths into a single path by positioning the lamp assemblies horizontally, and directing the two light paths to a combination mirror. Heat reduction is accomplished via infrared mirrors/absorbers and a visible spectra filter in the light path, as well as by pulling cooling air into the upper frame (30) and removing the heated air through the upper chamber exhaust port (33) by isolating the lamp chamber from the transport mechanism that holds the substrate. Modeling data for the system of FIG. 4 indicates a system efficiency of approximately 40%. In FIG. 4, an irradiating lamp assembly combines two lamp light spectra into one light path, in accordance with the present invention. Ultraviolet and infrared light spectra is generated from lamps (11) and (16) with the light being transmitted to combining mirror (13), via reflectors (10) and (17) that may have a dichroic coating to absorb some infrared light energy from the lamps, but transmit most of the UV spectra. The combining mirror may have a spherical or parabola surface to improve efficiency of the amount of transmitted light. The combining mirror (13) may also have a means to independently adjust the angle of light incidence from the lamp reflectors (10) and (17), to the substrate (15). The combined light is then transmitted through an optional light filter (14) mounted on a frame (36), where infrared or visible light is removed, before exposing the substrate (15). Reduction of heat generated by the lamp quartz envelopes is accomplished by isolating the upper chamber (30) from the lower chamber (31) by the light filter (14) mounted on a frame (36), while allowing the desired spectrum of light to transmit to the substrate (15). The substrate (15) is passed through the combined light path via a perforated transport belt (34) sliding on a heat exchanger with holes (37), which holds the substrate to the belt by vacuum generated by the lower chamber (31) exhaust/vacuum supply (32).

Figure 5:
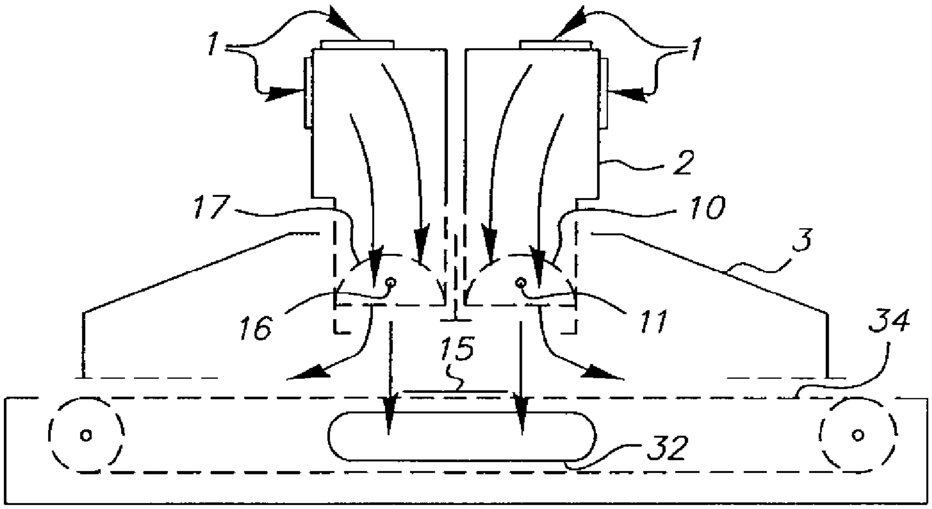
FIG. 5 (PRIOR ART)
FIG. 5 is a representation of the prior art—a Fusion UV conveyor assembly and dual lamp irradiator system. The drawing shows the major system components and airflow through the system.

FIG. 5 is a perspective view of a dual lamp ultraviolet light-curing unit commercially available from Fusion UV© according to the prior art. The system consists of a model LC-6B conveyor assembly and two F300S UV curing lamp irradiator assemblies. An ultraviolet and infrared spectrum is generated from lamps in the UV lamp assemblies (2), with cooling air supplied from filtered inlets (1). The lamp heated air then enters the transport assembly chamber (3), passes through the perforated transport belt (34) containing the substrate to be cured, then exits the conveyor assembly via the vacuum supply/lamp exhaust port (5) and entrance/exit of the conveyor tunnel.

Figure 6:
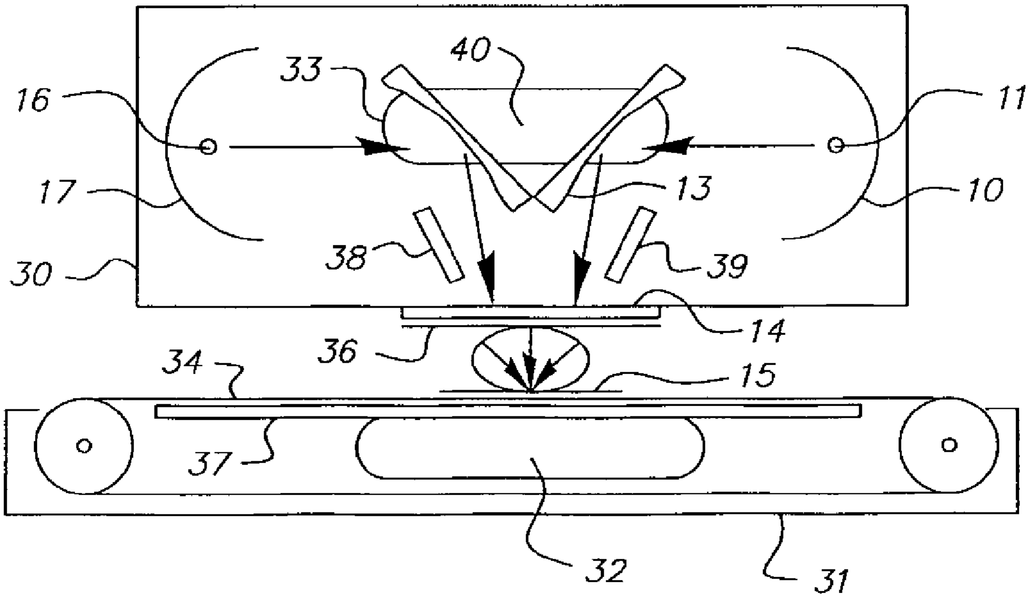
FIG. 6 is a representation of a preferred embodiment of the invention.

FIG. 6 is a representation of a preferred system to combine two light paths into a single path by positioning the lamp assemblies horizontally, and directing the two light paths to a combination mirror. Each of the beams from the two lamps are reflected off an angled mirror or special IR absorbing (hot) mirror to the substrate through a set of optional filters and through an optional mechanical on-off valve in such a way that the beams combine and simultaneously expose the substrate. Heat reduction is accomplished via infrared mirrors/absorbers and a visible spectra filter in the light path, as well as by pulling cooling air into the upper frame (30) and removing the heated air through the upper chamber exhaust port (33) by isolating the lamp chamber, preferably using a shutter-type mechanism, from the transport mechanism that holds the substrate. In FIG. 6, an irradiating lamp assembly combines two lamp light spectra into one light path, in accordance with the present invention. Ultraviolet and infrared light spectra is generated from lamps (11) and (16) with the light being transmitted to combining mirror (13), via reflectors (10) and (17) that may have a dichroic coating to absorb some infrared light energy from the lamps, but transmit most of the UV spectra. The combining mirror may have a spherical or parabola surface to improve efficiency of the amount of transmitted light. The combining mirror (13) may also have a means to independently adjust the angle of light incidence from the lamp reflectors (10) and (17), to the substrate (15). As a preferred embodiment, the combining mirror has a coating which absorbs the majority of the IR spectrum and reflects most of the UV. Funneling mirrors (38) and (39) increase the exposure by redirecting light that would otherwise miss the target to the substrate. The combined light is then transmitted through an optional light filter (14) mounted on a frame (36), where infrared or visible light is removed, and then through a mechanical shutoff (40), for example, a shutter, before exposing the substrate (15). Reduction of heat generated by the lamp quartz envelopes is accomplished by isolating the upper chamber (30) from the lower chamber (31) by the light filter (14) mounted on a frame (36), while allowing the desired spectrum of light to transmit to the substrate (15). The light filter/frame arrangement may further include a shutter to further isolate the light source from the substrate. The substrate (15) is passed through the combined light path via a perforated transport belt (34) sliding on a heat exchanger with holes (37), which holds the substrate to the belt by vacuum generated by the lower chamber (31) exhaust/vacuum supply (32).

Figure 8:
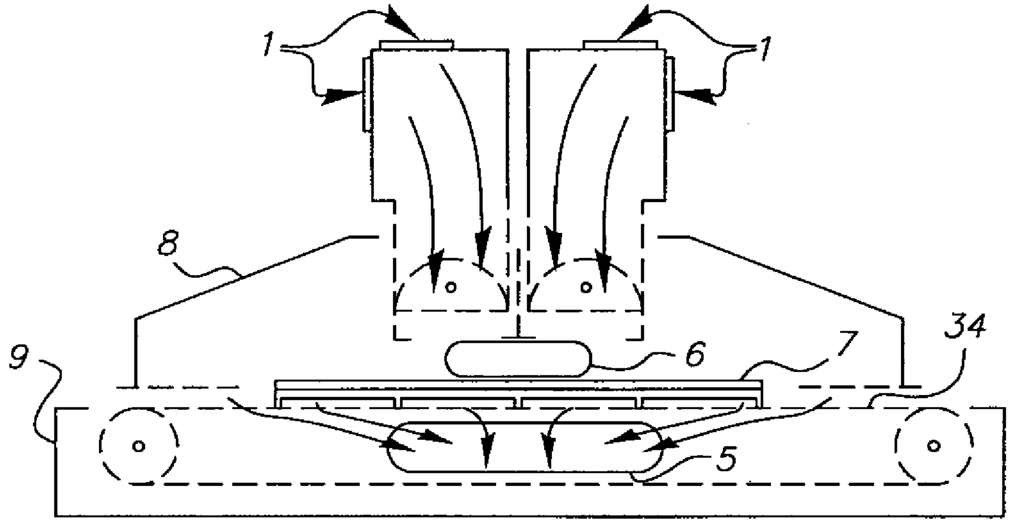
FIG. 8 is an illustration of the setup of the cure equipment utilized in the Examples.

FIG. 8 is a representation of a Fusion UV conveyor assembly and dual lamp irradiator system. This drawing shows modifications to the system with a separate, isolated exhaust port for lamp cooling air exhaust, and an upper/lower chamber isolation assembly. This improved chamber design limits the amount of heat from the lamps to the substrate by redirecting the lamp supply cooling air (1) to a new upper chamber exhaust port (6). The upper/lower chamber isolation assembly (7) serves to isolate the upper and lower chamber, as well as reduce the amount of heat sensed by the substrate on the transport belt (34).

The present invention may be used to cure any UV sensitive material. Preferably, the invention is used to cure materials difficult to cure with the prior art due to the presence of particles, flakes or droplets in the UV curable material or heat sensitivity of the UV curable materials or substrates.

In the method of the invention, a support, panel or object is provided, bearing a UV curable material, which is then exposed to a curing assembly comprising at least two light sources, wherein the spectrum of each of the light sources is combined into one single light path. Preferably, the method also includes removing a portion of the infrared energy from the light path through absorption of the IR on a surface that also reflects the UV spectrum. In the most preferred case of thermally sensitive UV curable materials, sufficient IR energy is removed to reduce or eliminate thermal transitioning of a thermally sensitive curable layer or a thermally sensitive layer associated with the curable layer. The method may include opening a shutter between the material and the light source prior to exposing the material on the substrate.

The method may include additional mirrors to collect stray light and funnel it to the target area to be cured. The method may also use a filter or filters through which the combined beam or individual beams pass that remove a portion of visible or IR light. The method may also use a mechanical shut off mechanism such as a rotary valve, sliding gate, or any of a number of designs to stop the light from reaching the target when not desired instead of turning the light sources on and off.

One specifically preferred use of the present invention relates to the manufacture of a flexible, cholesteric liquid crystal display. As used herein, the phase a "liquid crystal display" (LCD) is a type of flat panel display used in various electronic devices. At a minimum, an LCD comprises a substrate, at least one conductive layer and a liquid crystal layer. LCDs may also comprise two sheets of polarizing material with a liquid crystal solution between the polarizing sheets. The sheets of polarizing material may comprise a substrate of glass or transparent plastic. The LCD may also include functional layers.

The liquid crystal (LC) is used as an optical switch. The substrates are usually manufactured with transparent, conductive electrodes, in which electrical "driving" signals are coupled. The driving signals induce an electric field that can cause a phase change or state change in the LC material, the LC exhibiting different light reflecting characteristics according to its phase and/or state.

The present invention preferably employs, as a light modulating layer, chiral nematic liquid crystal compositions dispersed in a continuous matrix. Such materials are referred to as "polymer dispersed liquid crystal" materials or "PDLC" materials. Such materials may be made by a variety of methods. For example, Doane et al. (Applied Physics Letters 48, 269 (1986)) disclose a PDLC comprising approximately 0.4 mm droplets of nematic liquid crystal 5CB in a polymer binder, incorporated herein by reference. A phase separation method is used for preparing the PDLC. A solution containing monomer and liquid crystal is filled in a display cell and the material is then polymerized. Upon polymerization, the liquid crystal becomes immiscible and nucleates to form droplets. West et al. (Applied Physics Letters 63, 1471 (1993)), incorporated herein by reference, disclose a PDLC comprising a chiral nematic mixture in a polymer binder. Once again a phase separation method is used for preparing the PDLC. The liquid crystal material and polymer (a hydroxy functionalized polymethylmethacrylate) along with a crosslinker for the polymer are dissolved in a common organic solvent toluene and coated on an indium tin oxide (ITO) support. A dispersion of the liquid crystal material in the polymer binder is formed upon evaporation of toluene at high temperature.

The liquid crystalline material may be made by methods known to those of skill in the art, such as an emulsification method or a phase separation method. In a preferred embodiment, the liquid crystalline material may be fabricated using limited coalescence processing to form uniformly sized emulsions of liquid crystalline material. Such methods are disclosed in U.S. patent application Ser. No. 10/095,379, hereby incorporated by reference in its entirety. This may be done by homogenizing the liquid crystalline material in the presence of finely divided silica, and a coalescence limiting material, such as LUDOX from duPont Corporation. A promoter material may be added to the aqueous bath to drive the colloidal particles to the liquid-liquid interface. In a preferred embodiment, a copolymer of adipic acid and 2-(methylamino) ethanol may be used as the promoting agent in the water bath. The liquid crystal material may be dispersed using ultrasound to create liquid crystal domains below 1 micron in size. When the ultrasound energy is removed, the liquid crystal material coalesced into domains of uniform size. The ratio of smallest to largest domain size preferably varies by approximately 1:2. By varying the amount of silica and copolymer relative to the liquid crystalline material, uniform domain size emulsions of average diameters of approximately 1, 3, and, 8 microns may be produced, as determined by microscopy. These emulsions may be diluted in gelatin solution for subsequent coating.

Preferably, the domains are flattened spheres and have, on average, a thickness substantially less than their length, preferably at least 50% less. More preferably, the domains on average have a thickness (depth) to length ratio of 1:2 to 1:6. The flattening-of the domains may be achieved by proper formulation and sufficiently rapid drying of the coating. The domains preferably have an average diameter of 2 to 30 microns. The imaging layer preferably has a thickness of 10 to 150 microns when first coated and 2 to 20 microns when dried.

The flattened domains of liquid crystal material may be defined as having a major axis and a minor axis. In a preferred embodiment of a display or display sheet, the major axis is larger in size than the cell (or imaging layer) thickness for a majority of the domains. Such a dimensional relationship is shown in U.S. Pat. No. 6,061,107, hereby incorporated by reference in its entirety.

In a preferred embodiment, the contrast of the display is maximized by the use of only a substantial monolayer of N*LC domains. The term "substantial monolayer" is defined herein to mean that, in a direction perpendicular to the plane of the display, there is no more than a single layer of domains sandwiched between the electrodes at most points of the display (or the imaging layer), preferably at 75 percent or more of the points (or area) of the display, most preferably at 90 percent or more of the points (or area) of the display. In other words, at most, only a minor portion (preferably less than 10 percent) of the points (or area) of the display has more than a single domain (two or more domains) between the electrodes in a direction perpendicular to the plane of the display, compared to the amount of points (or area) of the display at which there is only a single domain between the electrodes.

The amount of material needed for a monolayer can be accurately determined by calculation based on individual domain size, assuming a fully closed packed arrangement of domains. In practice, there may be imperfections in which gaps occur and some unevenness due to overlapping droplets or domains. On this basis, the calculated amount is preferably less than 150 percent of the amount needed for monolayer domain coverage, preferably not more than 125 percent of the amount needed for a monolayer domain coverage, more preferably not more than 110 percent of the amount needed for a monolayer of domains. Furthermore, improved viewing angle and broadband features may be obtained by appropriate choice of differently doped domains based on the geometry of the coated droplet and the Bragg reflection condition.

The liquid crystalline layer or layers may also contain other ingredients. For example, while color is introduced by the liquid crystal material itself, pleochroic dyes may be added to intensify or vary the color reflected by the cell. Similarly, additives such as fumed silica may be dissolved in the liquid crystal mixture to adjust the stability of the various chiral nematic textures. A dye in an amount ranging from 0.25% to 1.5% may also be used.

At least one conductive layer may be utilized with the present invention. For higher conductivities, the conductive layer may comprise a silver-based layer which contains silver only or silver containing a different element such as aluminum (Al), copper (Cu), nickel (Ni), cadmium (Cd), gold (Au), zinc (Zn), magnesium (Mg), tin (Sn), indium (In), tantalum (Ta), titanium (Ti), zirconium (Zr), cerium (Ce), silicon (Si), lead (Pb) or palladium (Pd). In a preferred embodiment, the conductive layer comprises at least one of gold, silver and a gold/silver alloy, for example, a layer of silver coated on one or both sides with a thinner layer of gold. See, Int. Publ. No. WO 99/36261 by Polaroid Corporation, incorporated herein by reference. In another embodiment, the conductive layer may comprise a layer of silver alloy, for example, a layer of silver coated on one or both sides with a layer of indium cerium oxide (InCeO). See U.S. Pat. No. 5,667,853, incorporated herein in by reference.

The conductive layer may be formed in a vacuum environment using materials such as aluminum, tin, silver, platinum, carbon, tungsten, molybdenum, or indium. Oxides of these metals may be used to darken patternable conductive layers. The metal material may be excited by energy from resistance heating, cathodic arc, electron beam, sputtering or magnetron excitation. The conductive layer may comprise coatings of tin oxide or indium tin oxide, resulting in the layer being transparent. There may also be more than one conductive layer.

Modern chiral nematic liquid crystal materials usually include at least one nematic host combined with a chiral dopant. In general, the nematic liquid crystal phase is composed of one or more mesogenic components combined to provide useful composite properties. Many such materials are available commercially. The nematic component of the chiral nematic liquid crystal mixture may be comprised of any suitable nematic liquid crystal mixture or composition having appropriate liquid crystal characteristics. Nematic liquid crystals suitable for use in the present invention are preferably composed of compounds of low molecular weight selected from nematic or nematogenic substances, for example from the known classes of the azoxybenzenes, benzylideneanilines, biphenyls, terphenyls, phenyl or cyclohexyl benzoates, phenyl or cyclohexyl esters of cyclohexanecarboxylic acid; phenyl or cyclohexyl esters of cyclohexylbenzoic acid; phenyl or cyclohexyl esters of cyclohexylcyclohexanecarboxylic acid; cyclohexylphenyl esters of benzoic acid, of cyclohexanecarboxyiic acid and of cyclohexylcyclohexanecarboxylic acid; phenyl cyclohexanes; cyclohexyibiphenyls; phenyl cyclohexylcyclohexanes; cyclohexylcyclohexanes; cyclohexylcyclohexenes; cyclohexylcyclohexylcyclohexenes; 1,4-bis-cyclohexylbenzenes; 4,4-bis-cyclohexylbiphenyls; phenyl- or cyclohexylpyrimidines; phenyl- or cyclohexylpyridines; phenyl- or cyclohexylpyridazines; phenyl- or cyclohexyidioxanes; phenyl- or cyclohexyl-1,3-dithianes; 1,2-diphenylethanes; 1,2-dicyclohexylethanes; 1-phenyl-2-cyclohexylethanes; 1-cyclohexyl-2-(4-phenylcyclohexyl)ethanes; 1-cyclohexyl-2',2-biphenylethanes; 1-phenyl-2-cyclohexylphenylethanes; optionally halogenated stilbenes; benzyl phenyl ethers; tolanes; substituted cinnamic acids and esters; and further classes of nematic or nematogenic substances. The 1,4-phenylene groups in these compounds may also be laterally mono- or difluorinated. The liquid crystalline material of this preferred embodiment is based on the achiral compounds of this type. The most important compounds, that are possible as components of these liquid crystalline materials, may be characterized by the following formula R'-X-Y-Z-R" wherein X and Z, which may be identical or different, are in each case, independently from one another, a bivalent radical from the group formed by -Phe-, -Cyc-, -Phe-Phe-, -Phe-Cyc-, -Cyc-Cyc-, -Pyr-, -Dio-, -B-Phe- and -B-Cyc-; wherein Phe is unsubstituted or fluorine-substituted 1,4-phenylene, Cyc is trans-1,4-cyclohexylene or 1,4-cyclohexenylene, Pyr is pyrimidine-2,5-diyl or pyridine-2,5-diyl, Dio is 1,3-dioxane-2,5-diyl, and B is 2-(trans-1,4-cyclohexyl)ethyl, pyrimidine-2,5-diyl, pyridine-2,5-diyl or 1,3-dioxane-2,5-diyl. Y in these compounds is selected from the following bivalent groups —CH=CH—, —C≡C—, —N=N(O)—, —CH=CY'—, —CH=N(O)—, —CH2-CH2-, —CO—O—, —CH2-O—, —CO—S—, —CH2-S—, —COO-Phe-COO— or a single bond, with Y' being halogen, preferably chlorine, or —CN; R' and R" are, in each case, independently of one another, alkyl, alkenyl, alkoxy, alkenyloxy, alkanoyloxy, alkoxycarbonyl or alkoxycarbonyloxy with 1 to 18, preferably 1 to 12 C atoms, or alternatively one of R' and R" is —F, —CF3, —OCF3, —Cl, —NCS or —CN. In most of these compounds R' and R' are, in each case, independently of each another, alkyl, alkenyl or alkoxy with different chain length, wherein the sum of C atoms in nematic media generally is between 2 and 9, preferably between 2 and 7. The nematic liquid crystal phases typically consist of 2 to 20, preferably 2 to 15 components. The above list of materials is not intended to be exhaustive or limiting. The lists disclose a variety of representative materials suitable for use or mixtures, which comprise the active element in electro-optic liquid crystal compositions.

Suitable chiral nematic liquid crystal compositions preferably have a positive dielectric anisotropy and include chiral material in an amount effective to form focal conic and twisted planar textures. Chiral nematic liquid crystal materials are preferred because of their excellent reflective characteristics, bistability and gray scale memory. The chiral nematic liquid crystal is typically a mixture of nematic liquid crystal and chiral material in an amount sufficient to produce the desired pitch length. Suitable commercial nematic liquid crystals include, for example, E7, E48, E44, E31, E80, TL202, TL203, TL204 and TL205 manufactured by E. Merck. The chiral nematic material may comprise, for example, one or more of the following materials obtained from Merck Ltd.: BL061, BL100, BL101, BL087, BL118, and BL036. Although nematic liquid crystals having positive dielectric anisotropy, and, especially cyanobiphenyls, are preferred, virtually any nematic liquid crystal known in the art, including those having negative dielectric anisotropy, may be suitable for use in the invention. Chiral nematic liquid crystal materials may be Merck BL112, BL126, BL-03, BL-048 or BL-033, which are available from EM Industries of Hawthorne, N.Y. Other suitable materials may include ZLI-3308, ZLI-3273, ZLI-5048-000, ZLI-5049-100, ZLI-5100-100, ZLI-5800-000 and MLC-6041-100. Other light reflecting or diffusing modulating, electrically operated materials may also be coated, such as a microencapsulated electrophoretic material in oil. Examples of nematic hosts are mixtures containing 5CB or MBBA.

The chiral dopant added to the nematic mixture to induce the helical twisting of the mesophase, thereby allowing reflection of visible light, may be of any useful structural class. The choice of dopant depends upon several characteristics including among others its chemical compatibility with the nematic host, helical twisting power, temperature sensitivity, and light fastness. Many chiral dopant classes are known in the art: e.g., G. Gottarelli and G. Spada, *Mol. Cryst. Liq. Crys.,* 123, 377 (1985); G. Spada and G. Proni, *Enantiomer,* 3, 301 (1998) and references therein, incorporated herein by reference. Typical wellknown dopant classes include 1,1-binaphthol derivatives; isosorbide and similar isomannide esters as disclosed in U.S. Pat. No. 6,217,792, incorporated herein by reference; TADDOL derivatives as disclosed in U.S. Pat. No. 6,099,751, incorporated herein by reference; and the pending spiroindanes esters as disclosed in U.S. patent application Ser. No. 10/651,692 by T. Welter et al., filed Aug. 29, 2003, titled "Chiral Compounds And Compositions Containing The Same," hereby incorporated by reference.

The pitch length of the liquid crystal materials may be adjusted based upon the following equation (1):

$$\lambda_{max}=n_{av}p_0$$

where $\lambda_{max}$ is the peak reflection wavelength, that is, the wavelength at which reflectance is a maximum, $n_{av}$ is the average index of refraction of the liquid crystal material, and $p_0$ is the natural pitch length of the chiral nematic helix. Definitions of chiral nematic helix and pitch length and methods of its measurement, are known to those skilled in the art such as can be found in the book, Blinov, L. M., Electro-optical and Magneto-Optical Properties of Liquid Crystals, John Wiley & Sons Ltd. 1983, incorporated herein by reference. The pitch length is modified by adjusting the concentration of the chiral material in the liquid crystal material. For most concentrations of chiral dopants, the pitch length induced by the dopant is inversely proportional to the concentration of the dopant. The proportionality constant is given by the following equation (2):

$$p_0=1/(HTP.c)$$

where c is the concentration of the chiral dopant and HTP is the proportionality constant.

For some applications, it is desired to have LC mixtures that exhibit a strong helical twist and thereby a short pitch length. For example in liquid crystalline mixtures that are used in selectively reflecting chiral nematic displays, the pitch has to be selected such that the maximum of the wavelength reflected by the chiral nematic helix is in the range of visible light. Other possible applications are polymer films with a chiral liquid crystalline phase for optical elements, such as chiral nematic broadband polarizers, filter arrays, or chiral liquid crystalline retardation films. Among these are active and passive optical elements or color filters and liquid crystal displays, for example STN, TN, AMD-TN, temperature compensation, polymer free or polymer stabilized chiral nematic texture (PFCT, PSCT) displays. Possible display industry applications include ultralight, flexible, and inexpensive displays for notebook and desktop computers, instrument panels, video game machines, videophones, mobile phones, hand-held PCs, PDAs, e-books, camcorders, satellite navigation systems, store and supermarket pricing systems, highway signs, informational displays, smart cards, toys, and other electronic devices.

The liquid crystalline material may preferably be fabricated using limited coalescence processing to form uniformly sized emulsions of liquid crystalline material. This may be done by homogenizing the liquid crystalline material in the presence of finely divided silica, a coalescence limiting material, such as LUDOX from duPont Corporation. A promoter material may be added to the aqueous bath to drive the colloidal particles to the liquid-liquid interface. In a preferred embodiment, a copolymer of adipic acid and 2-(methylamino) ethanol may be used as the promoting agent in the water bath. The liquid crystal material may be dispersed using ultrasound to create liquid crystal domains below 1 micron in size. When the ultrasound energy is removed, the liquid crystal material coalesced into domains of uniform size. The ratio of smallest to largest domain size preferably varies by approximately 1:2. By varying the amount of silica and copolymer relative to the liquid crystalline material, uniform domain size emulsions of average diameters of approximately 1, 3, and, 8 micron may be produced, as determined by microscopy. These emulsions may be diluted in gelatin solution for subsequent coating.

The control of the droplet size of liquid crystals is extremely difficult because of the nature of such materials to continuously coalesce into ever increasing size droplets until a single phase results. In the preparation of photographic elements containing a layer having therein liquid crystal droplets, it has been found that the size of the liquid crystal droplets and the uniformity of the droplets size is a desirable parameter with regard to the quality of the photographic image, and the scratch resistance of the photographic element when it comes in contact with other parts of the apparatus in which it is employed, such as, cameras, photo processes apparatus, and the like. A particular embodiment of this is set forth in previously mentioned copending U.S. Pat. No. 5,529,891, incorporated herein by reference.

The liquid crystal droplets as described herein are prepared by forming a discontinuous phase of liquid crystal droplets in a continuous aqueous phase containing a particulate suspension stabilizing agent, reducing the size of the liquid crystal droplets and limiting the coalescence of the droplets by the action of the particulate suspension stabilizing agent on the surface of the droplets.

In one embodiment, the liquid crystal droplets may be made by a limited coalescence process wherein the liquid crystal is dissolved in a suitable solvent therefore, which solvent is removed by evaporation after the size of the droplets have been established by limiting the coalescence thereof. In a second embodiment, a permanent solvent may be mixed with the liquid crystal. This mixture may be dispersed in an aqueous medium and the size of the droplets by limiting the coalescence by the action of the suspension stabilizing agent. The permanent solvent, which has a higher surface energy remains in the droplet, thus avoiding the evaporation step as in the procedure outlined above. Either of these methods give narrow particle size distribution with the mean particle size of the droplets being controlled by the amount of the particulate suspension stabilizing agent employed in the preparation of the dispersion. Thus, the particular liquid crystal employed may be generally mixed with either the volatile solvent or with the permanent solvent and then dispersed in an aqueous medium containing the particulate suspension stabilizing agent and a promoter, the purpose of which is to drive the particulate suspension stabilizing agent to the interface between the liquid crystal droplet and the water medium. The dispersion of liquid crystal droplets in the aqueous medium may be vigorously mixed by any suitable device including high speed agitation, ultrasonic devices, and homogenizers, in order to reduce the particle size of the liquid crystal droplets to less than that ultimately desired. The presence of the particulate suspension stabilizer then controls the level of coalescence that takes place until an equilibrium is reached and the particle size does not grow any farther. In the preparation including the volatile solvent, the solvent may then be driven off by raising the temperature to above the volatilization temperature of the solvent. The droplets may be employed in the preparation of a coating composition for use in the preparation of an imaging element. In the case using a permanent solvent, the droplets including the permanent solvent are used directly in the preparation of the coating composition.

In order to provide suitable formulations for applying a layer containing the liquid crystal droplets, the dispersions prepared by either of the methods described above, are combined with a hydrophilic colloid, gelatin being the preferred material. Surfactants may be included with the liquid crystal dispersion prior to the addition of gelatin in order to prevent the removal of the particulate suspension stabilizing agent from the liquid crystal droplets. This aids in preventing further coalescence of the liquid crystal droplets.

Suitable hydrophilic binders include both naturally occurring substances such as proteins, protein derivatives, cellulose derivatives (e.g. cellulose esters), gelatins and gelatin derivatives, polysaccaharides, casein, and the like, and synthetic water permeable colloids such as poly(vinyl lactams), acrylamide polymers, poly(vinyl alcohol) and its derivatives, hydrolyzed polyvinyl acetates, polymers of alkyl and sulfoalkyl acrylates and methacrylates, polyamides, polyvinyl pyridine, acrylic acid polymers, maleic anhydride copolymers, polyalkylene oxide, methacrylamide copolymers, polyvinyl oxazolidinones, maleic acid copolymers, vinyl amine copolymers, methacrylic acid copolymers, acryloyloxyalkyl acrylate and methacrylates, vinyl imidazole copolymers, vinyl sulfide copolymers, and homopolymer or copolymers containing styrene sulfonic acid. Gelatin is preferred.

In one embodiment, a liquid crystal material is dispersed an aqueous bath containing a water soluble binder material such as deionized gelatin, polyvinyl alcohol (PVA) or polyethylene oxide (PEO). Such compounds are machine coatable on equipment associated with photographic films. It is desirable that the binder have a low ionic content. The presence of ions in such a binder hinders the development of an electrical field across the dispersed liquid crystal material. Additionally, ions in the binder can migrate in the presence of an electrical field, chemically damaging the light modulating layer. The liquid crystal and gelatin emulsion are coated to a thickness of between 5 and 30 microns to optimize optical properties of light modulating layer. The coating thickness, size of the liquid crystal domains, and concentration of the domains of liquid crystal materials are designed for optimum optical properties. Heretofore, the dispersion of liquid crystals is performed using shear mills or other mechanical separating means to form domains of liquid crystal within light modulating layer.

The LCD contains at least one transparent conductive layer, which typically is comprised of a primary metal oxide. This conductive layer may comprise other metal oxides such as indium oxide, titanium dioxide, cadmium oxide, gallium indium oxide, niobium pentoxide and tin dioxide. See, Int. Publ. No. WO 99/36261 by Polaroid Corporation, incorporated herein by reference. In addition to the primary oxide such as ITO, the at least one conductive layer may also comprise a secondary metal oxide such as an oxide of cerium, titanium, zirconium, hafnium and/or tantalum. See, U.S. Pat. No. 5,667,853 to Fukuyoshi et al. (Toppan Printing Co.), incorporated herein by reference. Other transparent conductive oxides include, but are not limited to $ZnO_2$, $Zn_2SnO_4$, $Cd_2SnO_4$, $Zn_2In_2O_5$, $MgIn_2O_4$, $Ga_2O_3$—$In_2O_3$, or $TaO_3$. The conductive layer may be formed, for example, by a low temperature sputtering technique or by a direct current sputtering technique, such as DC-sputtering or RF-DC sputtering, depending upon the material or materials of the underlying layer. The conductive layer may be a transparent, electrically conductive layer of tin oxide or indium tin oxide (ITO), or polythiophene, with ITO being the preferred material. Typically, the conductive layer is sputtered onto the substrate to a resistance of less than 250 ohms per square. Alternatively, conductive layer may be an opaque electrical conductor formed of metal such as copper, aluminum or nickel. If the conductive layer is an opaque metal, the metal may be a metal oxide to create a light absorbing conductive layer.

Indium tin oxide (ITO) is the preferred conductive material, as it is a cost effective conductor with good environmental stability, up to 90% transmission, and down to 20 ohms per square resistivity. An exemplary preferred ITO layer has a % transmittance (% T) greater than or equal to 80% in the visible region of light, that is, from greater than 400 nm to 700 nm, so that the film will be useful for display applications. In a preferred embodiment, the conductive layer comprises a layer of low temperature ITO that is polycrystalline. The ITO layer is preferably 10-120 nm in thickness, or 50-100 nm thick to achieve a resistivity of 20-60 ohms/square on plastic. An exemplary preferred ITO layer is 60-80 nm thick.

The conductive layer is preferably patterned. The conductive layer is preferably patterned into a plurality of electrodes. The patterned electrodes may be used to form a LCD device. In another embodiment, two conductive substrates are positioned facing each other and cholesteric liquid crystals are positioned therebetween to form a device. The patterned ITO conductive layer may have a variety of dimensions. Exemplary dimensions may include line widths of 10 microns, distances between lines, that is, electrode widths, of 200 microns, depth of cut, that is, thickness of ITO conductor, of 100 nanometers. ITO thicknesses on the order of 60, 70, and greater than 100 nanometers are also possible.

The display may also contain a second conductive layer applied to the surface of the light modulating layer. The second conductive layer desirably has sufficient conductivity to carry a field across the light modulating layer. The second conductive layer may be formed in a vacuum environment using materials such as aluminum, tin, silver, platinum, carbon, tungsten, molybdenum, or indium. Oxides of these metals may be used to darken pattenable conductive layers. The metal material may be excited by energy from resistance heating, cathodic arc, electron beam, sputtering or magnetron excitation. The second conductive layer may comprise coatings of tin oxide or indium tin oxide, resulting in the layer being transparent. Alternatively, second conductive layer may be printed conductive ink.

For higher conductivities, the second conductive layer may comprise a silver-based layer which contains silver only or silver containing a different element such as aluminum (Al), copper (Cu), nickel (Ni), cadmium (Cd), gold (Au), zinc (Zn), magnesium (Mg), tin (Sn), indium (In), tantalum (Ta), titanium (Ti), zirconium (Zr), cerium (Ce), silicon (Si), lead (Pb) or palladium (Pd). In a preferred embodiment, the conductive layer comprises at least one of gold, silver and a gold/silver alloy, for example, a layer of silver coated on one or both sides with a thinner layer of gold. See, Int. Publ. No. WO 99/36261 by Polaroid Corporation. In another embodiment, the conductive layer may comprise a layer of silver alloy, for example, a layer of silver coated on one or both sides with a layer of indium cerium oxide (InCeO). See U.S. Pat. No. 5,667,853, incorporated herein in by reference.

The LCD may also comprises at least one "functional layer" between the conductive layer and the substrate. The functional layer may comprise a protective layer or a barrier layer. The functional layer may be a UV curable layer. A preferred barrier layer may acts as a gas barrier or a moisture barrier and may comprise SiOx , AlOx or ITO. The protective layer, for example, an acrylic hard coat, functions to prevent laser light from penetrating to functional layers between the protective layer and the substrate, thereby protecting both the barrier layer and the substrate. The functional layer may also serve as an adhesion promoter of the conductive layer to the substrate In another embodiment, the polymeric support may further comprise an antistatic layer to manage unwanted charge build up on the sheet or web during roll conveyance or sheet finishing. Since the liquid crystal are switched between states by voltage, charge accumulation of sufficient voltage on the web surface may create an electrical field that when discharged may switch a portion of the liquid crystal. It is well know in the art of photographic web-based materials that winding, conveying, slitting, chopping and finishing can cause charge build on many web-based substrates. High charge buildup is a particular problem with plastic webs that are conductive on one side but not on the other side. Charges accumulates on one side on the web to the point of discharge and in photographic light sensitive materials that discharge can result in fog which is uncontrolled light exposure as a result of the spark caused from the discharge. Similar precaution and static management is necessary during manufacturing or in end use applications for liquid crystal displays. In another embodiment of this invention, the antistatic layer has a surface resistivity of between $10^5$ to $10^{12}$. Above $10^{12}$, the antistatic layer typically does not provide sufficient conduction of charge to prevent charge accumulation to the point of preventing fog in photographic systems or from unwanted point switching in liquid crystal displays. While layers greater than $10^5$ will prevent charge buildup, most antistatic materials are inherently not that conductive and in those materials that are more conductive than $10^5$, there is usually some color associated with them that will reduce the overall transmission properties of the display. The antistatic layer is separate from the highly conductive layer of ITO and provides the best static control when it is on the opposite side of the web substrate from that of the ITO layer. This may include the web substrate itself.

One type of functional layer may be a color contrast layer. Color contrast layers may be radiation reflective layers or radiation absorbing layers. In some cases, the rearmost substrate of each display may preferably be painted black. The black paint absorbs infrared radiation that reaches the back of the display. In the case of the stacked cell display, the contrast may be improved by painting the back substrate of the last visible cell black. The paint is preferably transparent to infrared radiation. This effectively provides the visible cell with a black background that improves its contrast, and yet, does not alter the viewing characteristics of the infrared display. Paint such as black paint, which is transparent in the infrared region, is known to those skilled in the art. For example, many types of black paint used to print the letters on computer keys are transparent to infrared radiation. In one embodiment, a light absorber may be positioned on the side opposing the incident light. In the fully evolved focal conic state, the chiral nematic liquid crystal is transparent, passing incident light, which is absorbed by the light absorber to create a black image. Progressive evolution of the focal conic state causes a viewer to perceive a reflected light that transitions to black as the chiral nematic material changes from planar state to a focal conic state. The transition to the light transmitting state is progressive, and varying the low voltage time permits variable levels of reflection. These variable levels may be mapped out to corresponding gray levels, and when the field is removed, the light modulating layer maintains a given optical state indefinitely. This process is more fully discussed in U.S. Pat. No. 5,437,811, incorporated herein by reference.

The color contrast layer may also be other colors. In another embodiment, the dark layer comprises milled non-conductive pigments. The materials are milled below 1 micron to form "nanopigments". Such pigments are effective in absorbing wavelengths of light in very thin or "sub micron" layers. In a preferred embodiment, the dark layer absorbs all wavelengths of light across the visible light spectrum, that is from 400 nanometers to 700 nanometers wavelength. The dark layer may also contain a set or multiple pigment dispersions. For example, three different pigments, such as a Yellow pigment milled to median diameter of 120 nanometers, a magenta pigment milled to a median diameter of 210 nanometers, and a cyan pigment, such as Sunfast® Blue Pigment 15:4 pigment, milled to a median diameter of 110 nanometers are combined. A mixture of these three pigments produces a uniform light absorption across the visible spectrum. Suitable pigments are readily available and are designed to be light absorbing across the visible spectrum. In addition, suitable pigments are inert and do not carry electrical fields.

Suitable pigments used in the color contrast layer may be any colored materials, which are practically insoluble in the medium in which they are incorporated. The preferred pigments are organic in which carbon is bonded to hydrogen atoms and at least one other element such as nitrogen, oxygen and/or transition metals. The hue of the organic pigment is primarily defined by the presence of one or more chromophores, a system of conjugated double bonds in the molecule, which is responsible for the absorption of visible light. Suitable pigments include those described in Industrial Organic Pigments: Production, Properties, Applications by W. Herbst and K. Hunger, 1993, Wiley Publishers, incorporated herein by reference. These include, but are not limited to, Azo Pigments such as monoazo yellow and orange, diazo, naphthol, naphthol reds, azo lakes, benzimidazolone, diazo condensation, metal complex, isoindolinone and isoindolinic, polycyclic pigments such as phthalocyanine, quinacridone, perylene, perinone, diketopyrrolo-pyrrole, and thioindigo, and anthriquinone pigments such as anthrapyrimidine, triarylcarbonium and quinophthalone.

The protective layer useful in the practice of the invention may be applied in any of a number of well known techniques, such as dip coating, rod coating, blade coating, air knife coating, gravure coating and reverse roll coating, extrusion coating, slide coating, curtain coating, and the like. The liquid crystal particles and the binder are preferably mixed together in a liquid medium to form a coating composition. The liquid medium may be a medium such as water or other aqueous solutions in which the hydrophilic colloid are dispersed with or without the presence of surfactants.

There are alternative display technologies to LCDs that may be used, for example, in flat panel displays. A notable example is organic or polymer light emitting devices, (OLEDs) or (PLEDs), which are comprised of several layers in which one of the layers is an organic material that can be made to electroluminesce by applying a voltage across the device. An OLED device is typically a laminate formed in a substrate such as glass or a plastic polymer. A light emitting layer of a luminescent organic solid, as well as adjacent semiconductor layers, are sandwiched between an anode and a cathode. The semiconductor layers may be hole-injecting and electron-injecting layers. PLEDs may be considered a subspecies of OLEDs in which the luminescent organic material is a polymer. The light emitting layers may be selected from any of a multitude of light emitting organic solids, e.g., polymers that are suitably fluorescent or chemiluminescent organic compounds. Such compounds and polymers include metal ion salts of 8-hydroxyquinolate, trivalent metal quinolate complexes, trivalent metal bridged quinolate complexes, Schiff-based divalent metal complexes, tin (IV) metal complexes, metal acetylacetonate complexes, metal bidenate ligand complexes incorporating organic ligands, such as 2-picolylketones, 2-quinaldylketones, or 2-(o-phenoxy) pyridine ketones, bisphosphonates, divalent metal maleonitriledithiolate complexes, molecular charge transfer complexes, rare earth mixed chelates, (5-hydroxy) quinoxaline metal complexes, aluminum tris-quinolates, and polymers such as poly (p-phenylenevinylene), poly(dialkoxyphenylenevinylene), poly(thiophene), poly(fluorene), poly(phenylene), poly(phenylacetylene), poly(aniline), poly(3-alkylthiophene), poly(3-octylthiophene), and poly(N-vinylcarbazole). When a potential difference is applied across the cathode and anode, electrons from the electron-injecting layer and holes from the hole-injecting layer are injected into the light emitting layer; they recombine, emitting light. OLEDs and PLEDs are described in the following United States patents, all of which are incorporated herein by this reference: U.S. Pat. No. 5,707,745 to Forrest et al., U.S. Pat. No. 5,721,160 to Forrest et al., U.S. Pat. No. 5,757,026 to Forrest et al., U.S. Pat. No. 5,834,893 to Bulovic et al., U.S. Pat. No. 5,861,219 to Thompson et al., U.S. Pat. No. 5,904,916 to Tang et al., U.S. Pat. No. 5,986,401 to Thompson et al., U.S. Pat. No. 5,998,803 to Forrest et al., U.S. Pat. No. 6,013,538 to Burrows et al., U.S. Pat. No. 6,046,543 to Bulovic et al., U.S. Pat. No. 6,048,573 to Tang et al., U.S. Pat. No. 6,048,630 to Burrows et al., U.S. Pat. No. 6,066,357 to Tang et al., U.S. Pat. No. 6,125,226 to Forrest et al., U.S. Pat. No. 6,137,223 to Hung et al., U.S. Pat. No. 6,242,115 to Thompson et al., and U.S. Pat. No. 6,274,980 to Burrows et al.

In a typical matrix address light emitting display device, numerous light emitting devices are formed on a single substrate and arranged in groups in a regular grid pattern. Activation may be by rows and columns, or in an active matrix with individual cathode and anode paths. OLEDs are often manufactured by first depositing a transparent electrode on the substrate, and patterning the same into electrode portions. The organic layer(s) is then deposited over the transparent electrode. A metallic electrode may be formed over the electrode layers. For example, in U.S. Pat. No. 5,703,436 to Forrest et al., incorporated herein by reference, transparent indium tin oxide (ITO) is used as the hole-injecting electrode, and a Mg—Ag—ITO electrode layer is used for electron injection.

The following examples are provided to illustrate the invention.

EXAMPLES

Example 1

Samples of Plain PET, Merck BL118 only, Merck BL 118 over coated with either a Black or Blue contrast layer were screen printed with EXGHAAMJ-AG conductive UV curable ink from Allied Photochemical. The samples were then cured using a Dual lamp fusion UV unit and conveyor system and tested for resistivity.

Black Nano and LC Coated Samples Composition

An aqueous coating dispersion layer of the chiral nematic composition was prepared containing 5 wt % gelatin, 8 wt % droplets of Merck BL118 obtained from Merck, Darmstadt, Germany and 0.20 wt % of coating surfactant. Microscopic analysis showed that the dispersion consisted of uniform 8 micron droplets of the liquid crystal in an aqueous gelatin medium. A second coating solution was prepared with 4 wt % gelatin and a mixture of nanopigments milled to less than 1 micron in size was formulated to provide a neutral black density. The two layers were coated and together had a resulting dried thickness of 14 microns.

Blue Nano and LC Coated Samples Composition

An aqueous coating dispersion layer of the chiral nematic composition was prepared containing 5 wt % gelatin, 8 wt % droplets of Merck BL118 obtained from Merck, Darmstadt, Germany and 0.20 wt % of coating surfactant. Microscopic analysis showed that the dispersion consisted of uniform 8 micron droplets of the liquid crystal in an aqueous gelatin medium. A second coating solution was prepared with 4 wt % gelatin and a mixture of nanopigments milled to less than 1 micron in size was formulated to provide a blue density. The two layers were coated and together had a resulting dried thickness of 14 microns.

The above mentioned composition was coated on five inch wide polyethylene terephthalate support, having ITO sputter coated to a resistance of 300 Ohms per square, obtained from Bekaert Specialty Films, San Diego Calif. Each of the samples were prepared by cutting each sample to length and labeled in preparation for screen-printing. Just prior to the screen-printing step, the samples were cleaned using ionized air.

Samples were then screen printed with Allied photochemical EXGHAAMJ-AG conductive silver ink on a DEK 248 screen printer. The image used was a 1 mm matrix design with 15 mm×15 mm test patches. The screen was fabricated on 7-355-34 polyester mesh from Sefar America.

The Cure equipment used was a Fusion FS-300s Dual and FS-300 Single UV lamp and LC-6 conveyor systems. The Dual lamp system was configured so that the samples were exposed using a D followed by H+ bulbs. The single was a single H bulb only. The UV energy for each lamp was measured and set for approx 0.45 mj/cm2 in the UVB region using a EIT "power puck" measurement device. Samples were placed on conveyor after approx 5 seconds lamp on time. FIG. 8 illustrates an arrangement for the cure equipment.

Once samples were printed and cured, the samples were then resistivity tested using a Fluke 83 III multi-meter by placing the probes in each corner of the 15 mm×15 mm test patch. The resistivity test were then taken a initial (fresh out of cure), 5, 10 and 30 minute intervals. In addition to resistivity testing, the samples were tested for blocking by placing the sample on a smooth table surface, covering it with a piece of plain Pet substrate and placing a 50 pound weigh on top. After 24 hours under the weight, the samples were then inspected to look for ink removal or damage. All data was recorded.

TABLE 1

| ID | Layers | Lamp | UV Energy (A) | UV Energy (B) | Initial Resist | 5 min Resist | 10 min Resist | 30 min Resist |
|---|---|---|---|---|---|---|---|---|
| 1-1 | PET | 1 | 0.521 | 0.432 | 6 | 6 | 4.7 | 4.7 |
| 1-2 | PET | 2 | 1.832 | 0.804 | 1.4 | 2.1 | 1.9 | 1.9 |
| 1-3 | PET LC | 1 | 0.521 | 0.432 | 6.2 | 6.2 | 5.2 | 5.2 |
| 1-4 | PET LC | 2 | 1.832 | 0.804 | 1.3 | 1.8 | 1.6 | 1.6 |
| 1-5 | PET LC Blue | 1 | 0.521 | 0.432 | 28 | 28 | 27 | 5 |
| 1-6 | PET LC Blue | 2 | 1.832 | 0.804 | 2.5 | 2.8 | 2.6 | 2.6 |
| 1-7 | PET LC Black | 1 | 0.521 | 0.432 | 65 | 101 | 101 | 101 |
| 1-8 | PET LC Black | 2 | 1.832 | 0.804 | 4 | 3.6 | 3.6 | 3.6 |

Figure 7:
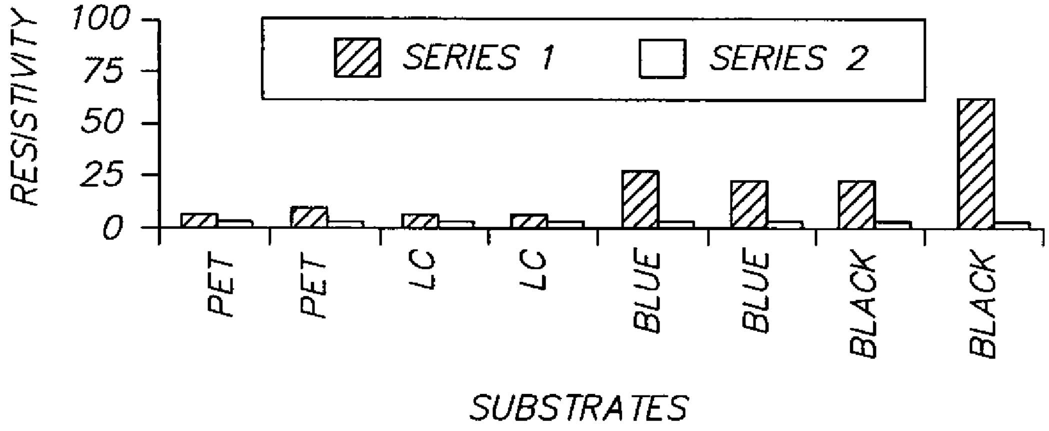
FIG. 7 is a plot of the substrate resistivity results (Single Lamp vs. prior art Fusion Dual lamp of FIG. 5 where the light sources are separated and conveyed through the single or dual UV exposing unit at 13'/min) of Example 1, Table 1.

Table 1 shows that sample printed and cured with the dual bulb system showed lower and more stable resistivities in less time. This is indicative of a more complete cure. The samples with contrasting layers, which have been difficult to cure, showed dramatic improvement over those cured with the single bulb energy. Dual bulb spectra (D & H+) exposure of various coated layers on substrates result in very low sheet resistivities, which indicates a fully cured polythiophene silver ink. The data of Table 1 are plotted in FIG. 7.

Example 2

Black Nano and LC Coated Samples Composition

An aqueous coating dispersion layer of the chiral nematic composition was prepared containing 5 wt % gelatin, 8 wt % droplets of Merck BL118 obtained from Merck, Darmstadt, Germany and 0.20 wt % of coating surfactant. Microscopic analysis showed that the dispersion consisted of uniform 8 micron droplets of the liquid crystal in an aqueous gelatin medium. The solution was mixed with gelatin crosslinker bisvinylsulfonylmethane at 3 wt % relative to the total amount of gelatin immediately before coating.

A second coating solution was prepared with 4 wt % gelatin and a mixture of nanopigments milled to less than 1 micron in size was formulated to provide a neutral black density (CMYK) layer. The two layers were coated and together had a resulting dried thickness of 14 microns.

Carbon Black Nano and LC Coated Samples Composition

An aqueous coating dispersion layer of the chiral nematic composition was prepared containing 5 wt % gelatin, 8 wt % droplets of Merck BL118 obtained from Merck, Darmstadt, Germany and 0.20 wt % of coating surfactant. Microscopic analysis showed that the dispersion consisted of uniform 8 micron droplets of the liquid crystal Lin an aqueous gelatin medium. The solution was mixed with gelatin crosslinker bisvinylsulfonylmethane at 3 wt % relative to the total amount of gelatin immediately before coating.

A second coating solution was prepared with 4 wt % gelatin and a mixture of carbon black was formulated to provide a black density (CB) layer. The two layers were coated and together had a resulting dried thickness of 14 microns.

Blue Nano and LC Coated Samples Composition

An aqueous coating dispersion layer of the chiral nematic composition was prepared containing 5 wt % gelatin, 8 wt % droplets of Merck BL118 obtained from Merck, Darmstadt, Germany and 0.20 wt % of coating surfactant. Microscopic analysis showed that the dispersion consisted of uniform 8 micron droplets of the liquid crystal in an aqueous gelatin medium. The solution was mixed with gelatin crosslinker bisvinylsulfonylmethane at 3 wt % relative to the total amount of gelatin immediately before coating.

A second coating solution was prepared with 4 wt % gelatin and a mixture of nanopigments milled to less than 1 micron in size was formulated to provide a blue density (CM) layer. The two layers were coated and together had a resulting dried thickness of 14 microns.

The above mentioned composition was coated on five inch wide polyethylene terephthalate support, having ITO sputter coated to a resistance of 300 Ohms per square, obtained from Bekaert Specialty Films, San Diego Calif. Each of the samples were prepared by cutting each sample to length and labeled in preparation for screen-printing. Just prior to the screen-printing step, the samples were cleaned using ionized air.

Samples were then screen printed with Allied photochemical EXGHAAMJ-AG conductive silver ink on a DEK 248 screen printer. The image used was a 1 mm matrix design with 15 mm×15 mm test patches. The screen was fabricated on 7-355-34 polyester mesh from Sefar America.

Curing Fusion Unit Configuration

The Cure equipment used was a Fusion FS-300 Dual and FS-300 Single UV lamp and LC-6 conveyor systems. The Dual lamp system was configured so that the samples were exposed using a D followed by H+ bulbs. The single was a single H bulb only. The UV energy for each lamp was measured and set for approx 0.45 mj/cm2 in the UVB region using a EIT "power puck" measurement device. Samples were placed on conveyor after approx 5 seconds lamp on time. The filters (quartz and IR) were housed in an aluminum holder that was placed between the UV light'source and the substrate. UV power puck readings were taken to verify the readings with and without the filters.

Once samples were printed and cured, the samples were then resistivity tested using a Fluke 83 III multitester by placing the probes in each corner of the 15 mm×15 mm test patch. The resistivity test was then taken at initial (fresh out of cure) and 30 minute intervals.

TABLE 2

| Sample # | Coating type applied to PET substrate | Lamp: S* or D** | Quartz plus | Initial Resistance | 30 min. resistance | |
|---|---|---|---|---|---|---|
| 2-1 | BL 118 | S | none | 7.2 | 5 | 2.2 |
| 2-2 | BL 118 | D | none | 6.4 | 4 | 2.4 |
| 2-4 | BL 118 | D | +1R | 5.7 | 2.7 | 3 |
| 2-7 | BL 118 | D | +2R | 5.6 | 3.7 | 1.9 |
| 2-9 | BL118 with CMYK | S | none | 38,000 | 69 | 38K |
| 2-10 | BL118 with CMYK | D | none | 16.5 | 10.2 | 6.3 |
| 2-12 | BL118 with CMYK & hardener | D | +1R | 12.7 | 5.7 | 7 |
| 2-14 | BL118 with CB & hardener | D | +1R | 4.9 | 4.4 | 0.5 |
| 2-16 | BL118 with CMYK | D | +1R | 13.3 | 6 | 7.3 |
| 2-19 | BL118 with CMYK & hardener | D | +2R | 21.5 | 7.5 | 14 |
| 2-21 | BL118 LC with CB & hardener | D | +2R | 17.1 | 8.1 | 9 |
| 2-23 | BL118 with CMYK | D | +2R | 14.1 | 8.3 | 5.8 |
| 2-24 | BL118 with CMYK | D | +2R | 10.2 | 6.2 | 4 |
| 2-25 | 575 nm LC with CM | S | none | 36 | 9.5 | 26.5 |
| 2-26 | 575 nm LC with CM | D | none | 6.2 | 3.1 | 3.1 |
| 2-28 | 575 nm LC with CM | D | +1R | 5.6 | 3.8 | 1.8 |
| 2-31 | 575 nm LC with CM | D | +2R | 7.1 | 3.5 | 3.6 |

S means a single energy source.
D means dual energy sources.

Table 2 shows that samples printed and cured with the dual bulb system alone, as well as with quartz and IR filters, showed lower and more stable resistivities in less time than those cured with the single bulb system. This is indicative of a more complete cure.

Example 3

The samples utilized above in Example 2 were also evaluated for thermal sensitivity. Once samples were printed and cured, the thermal transition of the coating was evaluated to determine the impact of the quartz and IR filters on the elimination/reduction of thermal transition (without impacting resistivity). The thermal transition was evaluated by visually looking at each sample to identify the existence of thermally transitioned liquid crystal.

TABLE 3

| Sample # | Coating type | Lamp: S* or D** | Quartz plus | Heat Sink/ Exchanger | Thermal transition |
|---|---|---|---|---|---|
| 3-1 | BL 118 | S | none | none | 3 |
| 3-2 | BL 118 | D | none | none | 3 |
| 3-3 | BL 118 | D | +1R | none | 3 |
| 3-6 | BL 118 | D | +2R | none | 3 |
| 3-6B | BL 118 | D | none | yes | 3 |
| 3-9 | BL118 with CMYK | S | none | none | 3 |
| 3-10 | BL118 with CMYK | D | none | none | 1 |
| 3-11 | BL118 with CMYK & hardener | D | +1R | none | 1 |
| 3-13 | BL118 with CB & hardener | D | +1R | none | 1 |
| 3-15 | BL118 with CMYK | D | +1R | none | 1 |
| 3-18 | BL118 with CMYK & hardener | D | +2R | none | 1 |
| 3-20 | BL118 with CB & hardener | D | +2R | none | 1 |
| 3-22 | BL118 with CMYK | D | +2R | none | 1 |
| 3-22B | BL118 with CMYK | D | none | yes | 3 |
| 3-23B | BL118 with CB & hardener | D | none | yes | 3 |

TABLE 3-continued

| Sample # | Coating type | Lamp: S* or D** | Quartz plus | Heat Sink/ Exchanger | Thermal transition |
|---|---|---|---|---|---|
| 3-25 | 575 nm LC with CM | S | none | none | 1 |
| 3-26 | 575 nm LC with CM | D | none | none | 1 |
| 3-27 | 575 nm LC with CM | D | +1R | none | 1 |
| 3-30 | 575 nm LC with CM | D | +2R | none | 1 |
| 3-30B | 575 nm LC with CM | D | none | yes | 3 |

Thermal transition:
1 = yes,
2 = partial,
3 = no

Table 3 shows the impact the IR and quartz filters had on the thermal transition of the liquid crystal. The thermal transition was rated on a scale of 1 to 3 (1=thermal transition, 2 being partial, and 3 being none). Table 3 shows that the BL118 only samples performed well and the all the rest had thermal transition. The color of the contrast or pigmented layer has a greater impact on the thermal transition of the liquid crystal layer (due to IR absorption) than the use of the filters, possibly as a result of higher heat generation during the UV cure process via the pigmented dark layer coating opacities. Coatings containing a pigmented or dark layer over the liquid crystal layer were thermally transitioned during the UV cure process when not using thermal reduction mechanism, such as, for example, a heat sink, under the panel.

Example 4

TABLE 4

| Cure method | UVA ($J/cm^2$) | UVB (J/cm2) | UVC (J/cm2) | UVV (J/cm2) | 2 minute Resistivity (ohms/sq) | 24 hour Resistivity (ohms/sq) |
|---|---|---|---|---|---|---|
| Fusion Dual Wavelength | 0.751 | 0.343 | 0.049 | 0.328 | Open | 3.4 |
| Fusion Dual Wavelength | 0.751 | 0.343 | 0.049 | 0.328 | Open | 2.9 |
| Fusion Dual Wavelength | 0.751 | 0.343 | 0.049 | 0.328 | Open | 3 |
| Combined Beam Dual Wavelength | 0.772 | 0.34 | 0.054 | 0.182 | 3.1 | 1.2 |
| Combined Beam Dual Wavelength | 0.772 | 0.34 | 0.054 | 0.182 | 2.9 | 1 |
| Combined Beam Dual Wavelength | 0.772 | 0.34 | 0.054 | 0.182 | 8.9 | 2.9 |

Open = no measurable conductivity

Table 4 shows the conductivity of EXGHAAMJ-AG (389) UVB curable conductive ink from Allied Photochemical of Kimball, Mich., when screen printed using 325 stainless steel mesh and exposed at comparable levels of UVB exposure on both the Fusion FS:-300 Dual wavelength unit and the new combined beam-dual wavelength unit. The FS-300 Dual unit had a D bulb exposure followed by an H+ bulb. The exposure delay between the bulbs was 1.4 seconds on the FS-300 unit. The combined beam—dual wavelength unit of this invention was configured as depicted in FIG. 6, with both a D and H+ bulb with both beams combined to expose the substrate simultaneously. The substrate used in Table 4 was cholesteric liquid crystal and a dark layer on an ITO and PET substrate as described previously.

The results demonstrate quantitatively the remarkable improvement in curing over the prior art, as measured by the dramatically improved conductivity after 2 minutes of exposure. When the Allied EXGHAAMJ-AG (389) silver bearing PTF ink in exposed in the FS-300 unit dual wavelength unit with a 1.4 second delay between exposure by the D bulb and H+ bulb, the resistance is infinite or no conductivity. The same ink exposed simultaneously at the same exposures by the same D and H+ bulbs combined in the inventive assembly results in a low resistance of 3.1, 2.9 and 8.9 ohms/square for the three samples. The reduced resistance is a direct measure of the rate of cure. As can be seen from the 24-hour data, the ink exposed by the FS-300 dual system eventually becomes conductive but still not as conductive as the simultaneous exposure method of this invention. Where rapid curing without an extended hold is desirable, for example, winding in a roll-to-roll process, the dramatically improved curing rate is most advantageous. The reduced resistance or higher conductivity is a most advantageous property for many circuit applications.

The invention has been described in detail with particular reference to certain preferred embodiments thereof, but it will be understood that variations and modifications can be effected within the spirit and scope of the invention.

PARTS LIST 1 lamp assembly cooling air input
2 UV lamp assemblies
3 lamp assembly and belt transport chamber
5 vacuum supply/lamp exhaust port
6 upper chamber lamp exhaust port
7 upper/lower chamber isolation assembly
8 upper chamber 9 lower chamber
10 #1 lamp reflector
11 #1 lamp
12 Fold mirror
13 Combining mirror
14 Light filter
15 Substrate
16 #2 lamp
17 #2 lamp reflector
20 refractive element
30 upper chamber
31 lower chamber
32 lower chamber exhaust/vacuum supply
33 upper chamber exhaust port
34 perforated transport belt
35 infrared reflector/absorber
36 frame for light filter
37 heat exchanger plate with holes
38 lamp #2 funneling mirror
39 lamp #1 funneling mirror
40 mechanical shutoff

The invention claimed is:

1. A curing assembly comprising at least two light sources each having a lamp and an associated reflector, wherein each of said at least two light sources has a spectrum, wherein said spectrum of each of said at least two light sources is directed to a reflective or refractive element by each associated reflector and combined into one light path wherein the curing assembly is mounted in a fixed position relative to a conveyor system, and wherein said at least two light sources are capable of curing a material on said conveyor system exposed to said one combined light path.

2. The curing assembly of claim 1 wherein said at least two light sources have different spectra.

3. The curing assembly of claim 1 wherein the lamps for said at least two light sources are at least one short wavelength UV bulb and at least one long wavelength UV bulb.

4. The curing assembly of claim 1 further comprising at least one reflector for combining said spectrum of each of said at least two light sources into one light path.

5. The curing assembly of claim 1 wherein said reflector is a mirror.

6. The curing assembly of claim 5 wherein said mirror is a cold mirror, wherein said cold mirror reflects portions of said spectrum of each of said at least two light sources.

7. The curing assembly of claim 5 wherein said mirror is a hot mirror, wherein said hot mirror absorbs portions of said spectrum of each of said at least two light sources.

8. The curing assembly of claim 1 further comprising at least one refractive element for said spectrum of each of said at least two light sources into one light path.

9. The curing assembly of claim 1 further comprising a filter.

10. The curing assembly of claim 9 wherein said filter is a visible light filter.

11. The curing assembly of claim 9 wherein said filter is an IR filter.

12. The curing assembly of claim 1 wherein said at least two light sources have adjustable intensity.

13. The curing assembly of claim 12 wherein said adjustable intensity is adjusted by varying the focal length, wherein said focal length is the distance from said material to said at least one light source.

14. The curing assembly of claim 1 further comprising a shutter between said material and said at least one light source.

15. The curing assembly of claim 1 further comprising a thermal reduction system.

16. The curing assembly of claim 1 wherein said material is a light curable material associated with a heat sensitive material and said light curable material is positioned between said one combined light path and said heat sensitive material.

17. The curing assembly of claim 16 wherein said material is an electrically imageable material.

18. The curing assembly of claim 17 wherein said electrically imageable material is a polymer dispersed liquid crystal (PDLC) material.

19. The curing assembly of claim 15 further comprising a color contrast pigmented layer.

20. The curing assembly of claim 1 wherein said material is a heat sensitive material.

21. The curing assembly of claim 2 further comprising at least one reflector, at least one shutter, and a thermal reduction system.

22. The curing assembly of claim 21 further comprising at least one filter.

23. The curing assembly of claim 21 wherein said thermal reduction system comprises at least one heat sink, at least one heat exchanger, or a combination thereof.

24. The curing assembly of claim 21 wherein said at least one reflector comprises hot mirrors and funneling mirrors.

25. The curing assembly of claim 21 curable material associated with a liquid crystal layer and at least one color contrast pigmented layer.

26. A process for curing a material comprising:

providing a curable material; and exposing said curable material to a combined light path from a curing assembly, wherein said curing assembly comprises at least two light sources, wherein each of said at least two light sources each having a lamp and an associated reflector, has a spectrum, wherein said spectrum of each of said at least two light sources is directed to a reflective or refractive element by each associated reflector and combined into one light path, and wherein said at least two light sources are capable of curing a material on a conveyor system exposed to said one combined light path.

27. The process of claim 26 where said process is a roll-to-roll or continuous process.

28. The process of claim 26 wherein the lamps for said material is a light curable material associated with a heat sensitive material and said light curable material is positioned between said one combined light path and said heat sensitive material.

29. The process of claim 28 curable material associated with a liquid crystal layer and at least one color contrast pigmented layer.

30. The process of claim 26 wherein said at least two sources have different spectra.

31. The process of claim 26 wherein said at least two light sources are at least one short wavelength UV bulb and at least one long wavelength UV bulb.

32. The process of claim 26 wherein said providing a curable material is providing a curable material on a moving belt.

33. The process of claim 26 further comprising removing heat using a thermal reduction system.

34. The process of claim 33 wherein said thermal reduction system comprises at least one heat sink, at least one heat exchanger, or a combination thereof.

35. The process of claim 26 further comprising opening a shutter between said material and said at least one light source prior to said exposing and closing said shutter after said exposing.

36. The process of claim 26 wherein the curing assembly further comprising at least one reflector for combining said spectrum of each of said at least two light sources into one light path.

37. The process of claim 26 further comprising at least one refractive element for directing said spectrum of each of said at least two light sources into one light path.

38. The process of claim 26 further comprising a heat reduction filter to reduce heat generated for the light source.

39. The process of claim 38 wherein said material is a heat sensitive material and therefore heat reduction is necessary.

40. A curing assembly comprising at least one reflector, comprising hot mirrors and funneling mirrors, at least one shutter, and a thermal reduction system, at least two light sources, wherein each of said at least two light sources has a spectrum, wherein said spectrum of each of said at least two light sources is combined into one light path, and wherein said at least two light sources are capable of curing a material exposed to said one combined light path.

* * * * *